United States Patent
Kato

(10) Patent No.: US 10,374,053 B2
(45) Date of Patent: Aug. 6, 2019

(54) SEMICONDUCTOR DEVICE AND MANUFACTURING METHOD THEREOF

(71) Applicant: Renesas Electronics Corporation, Tokyo (JP)

(72) Inventor: Yoshitake Kato, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/513,545

(22) PCT Filed: Mar. 30, 2015

(86) PCT No.: PCT/JP2015/059956
§ 371 (c)(1),
(2) Date: Mar. 22, 2017

(87) PCT Pub. No.: WO2016/157371
PCT Pub. Date: Oct. 6, 2016

(65) Prior Publication Data
US 2017/0317183 A1    Nov. 2, 2017

(51) Int. Cl.
*H01L 29/51*        (2006.01)
*H01L 21/28*        (2006.01)
(Continued)

(52) U.S. Cl.
CPC ...... *H01L 29/513* (2013.01); *H01L 21/28264* (2013.01); *H01L 29/2003* (2013.01);
(Continued)

(58) Field of Classification Search
CPC .......... H01L 21/28264; H01L 29/2003; H01L 29/778; H01L 29/7786; H01L 29/7787;
(Continued)

(56) References Cited

U.S. PATENT DOCUMENTS 6,573,599 B1 *  6/2003  Burton ............. H01L 21/28575
                                                                257/745
8,987,077 B2     3/2015  Oka
(Continued)

FOREIGN PATENT DOCUMENTS

JP     H 02-229431 A    9/1990
JP     2007-324593 A   12/2007
(Continued)

OTHER PUBLICATIONS

International Search Report (ISR) (PCT Form PCT/ISA/210), in PCT/JP2015/059956, dated Jun. 16, 2015.
(Continued)

*Primary Examiner* — David C Spalla
(74) *Attorney, Agent, or Firm* — McGinn IP Law Group, PLLC

(57) ABSTRACT

The characteristics of a semiconductor device are enhanced. In a semiconductor device (MISFET) having a gate electrode GE formed on a nitride semiconductor layer CH via a gate insulating film GI, the gate insulating film GI is configured to have a first gate insulating film (oxide film of a first metal) GIa formed on the nitride semiconductor layer CH and a second gate insulating film (oxide film of a second metal) GIb. And, the second metal (e.g., Hf) has lower electronegativity than the first metal (e.g., Al). By thus making the electronegativity of the second metal lower than the electronegativity of the first metal, a threshold voltage (Vth) can be shifted in a positive direction. Moreover, the gate electrode GE is configured to have a first gate electrode (nitride film of a third metal) GEa formed on the second gate insulating film GIb and a second gate electrode (fourth metal) GEb. This prevents the diffusion of oxygen to the gate insulating film GI, and variations in the threshold voltage (Vth) can be reduced.

23 Claims, 15 Drawing Sheets

(51) Int. Cl.
  *H01L 29/20* (2006.01)
  *H01L 29/40* (2006.01)
  *H01L 29/423* (2006.01)
  *H01L 29/49* (2006.01)
  *H01L 29/66* (2006.01)
  *H01L 29/778* (2006.01)

(52) U.S. Cl.
  CPC ........ *H01L 29/408* (2013.01); *H01L 29/4236* (2013.01); *H01L 29/4966* (2013.01); *H01L 29/517* (2013.01); *H01L 29/7786* (2013.01); H01L 29/4238 (2013.01); H01L 29/66462 (2013.01); H01L 29/66522 (2013.01); H01L 29/7787 (2013.01)

(58) Field of Classification Search
  CPC ......... H01L 29/66522; H01L 29/66462; H01L 29/66431; H01L 29/517
  See application file for complete search history.

(56) References Cited

U.S. PATENT DOCUMENTS

| | | |
|---|---|---|
| 2007/0272967 A1 | 11/2007 | Pantisano et al. |
| 2011/0068371 A1 | 3/2011 | Oka |
| 2011/0272742 A1* | 11/2011 | Akiyama .............. H01L 21/324 257/194 |
| 2012/0049180 A1 | 3/2012 | Yamada |
| 2013/0105808 A1* | 5/2013 | Wong .................... H01L 29/517 257/76 |
| 2014/0004669 A1 | 1/2014 | Oka |
| 2014/0021513 A1 | 1/2014 | Akiyama et al. |
| 2014/0092636 A1* | 4/2014 | Kanamura .......... H01L 29/4966 363/17 |
| 2014/0264364 A1 | 9/2014 | Kanamura |
| 2014/0287572 A1* | 9/2014 | Mizukami ......... H01L 21/28264 438/502 |
| 2015/0236121 A1* | 8/2015 | Chiu ................. H01L 29/66462 257/194 |

FOREIGN PATENT DOCUMENTS

| | | |
|---|---|---|
| JP | 2011-071206 A | 4/2011 |
| JP | 2011-238700 A | 11/2011 |
| JP | 2012-064352 A | 3/2012 |
| JP | 2013-168433 A | 8/2013 |
| JP | 2014-183125 A | 9/2014 |

OTHER PUBLICATIONS

Taiwanese Office Action dated Apr. 22, 2019, in Taiwanese Patent Application No. 104143212 with an English translation.

* cited by examiner

SEMICONDUCTOR DEVICE AND MANUFACTURING METHOD THEREOF

TECHNICAL FIELD

The present invention relates to a semiconductor device and a manufacturing method of the semiconductor device and, for example, can be suitably utilized for a semiconductor device using a nitride semiconductor and a manufacturing method thereof.

BACKGROUND ART

In recent years, semiconductor devices using a compound of III-V group having a greater band gap than Si have been attracting attention. Among these, a semiconductor device using a nitride semiconductor such as gallium nitride (GaN) has characteristics to operate with high speed and low loss. Moreover, a power metal insulator semiconductor field effect transistor (MISFET) using a gallium nitride based nitride semiconductor can perform normally-off operation, and its development is under way.

For example, the undermentioned Patent Document 1 (JP 2014-183125 A) discloses a normally-off type semiconductor device having an electron transit layer formed of i-GaN, an electron supply layer formed of AlGaN, a source electrode, a drain electrode and a gate electrode formed on an insulating film. The gate electrode is formed by lift-off using Ni/Au.

RELATED ART DOCUMENT

Patent Document

Patent Document 1: Japanese Patent Application Laid-Open Publication No. 2014-183125

SUMMARY OF THE INVENTION

Problems to be Solved by the Invention

The inventor has been engaged in the research and development of this type of semiconductor device using a nitride semiconductor and diligently studying the characteristics of a normally-off type semiconductor device for enhancement. In the process, it turned out that there was room for further improvement in the semiconductor device using a nitride semiconductor and a manufacturing method of the semiconductor device.

The above and other preferred aims and novel characteristics of the present invention will be apparent from the description of the present specification and the accompanying drawings.

Means for Solving the Problems

The typical ones of the inventions disclosed in the present application will be briefly described as follows.

Effects of the Invention

A semiconductor device according to an embodiment disclosed in the present application includes a first gate insulating film, a second gate insulating film, a first gate electrode, and a second gate electrode. And, the first gate insulating film is an oxide film containing a first metal or an oxide film containing silicon, the second gate insulating film is an oxide film containing a second metal, in which electronegativity of the second metal is smaller than that of the first metal or silicon. In addition, the first gate electrode is a nitride film containing a third metal, and the second gate electrode is formed of a fourth metal.

A manufacturing method of a semiconductor device according to an embodiment disclosed in the present application includes a step of forming the first gate insulting film on the nitride semiconductor layer, the first gate insulating film being formed of an oxide film containing the first metal or an oxide film containing silicon. And the method includes steps of forming the second gate insulating film on the first gate insulating film, the second gate insulating film being formed of an oxide film of the second metal and forming the first gate electrode on the second gate insulating film, the first gate electrode being formed of a nitride film containing a third metal. In addition, the method includes a step of forming the second gate electrode on the first gate electrode, the second gate electrode being formed of a fourth metal. Further, the first gate insulating film is an oxide film containing the first metal or an oxide film containing silicon, the second gate insulating film is an oxide film containing the second metal, and electronegativity of the second metal is smaller than that of the first metal or silicon.

According to the semiconductor device described in the following representative embodiments disclosed in the present application, the characteristics of the semiconductor device can be enhanced.

According to the manufacturing method of the semiconductor device described in the following representative embodiments disclosed in the present application, a semiconductor device having good characteristics can be manufactured.

BRIEF DESCRIPTIONS OF THE DRAWINGS

DETAILED DESCRIPTION OF PREFERRED EMBODIMENTS

Figure 1:
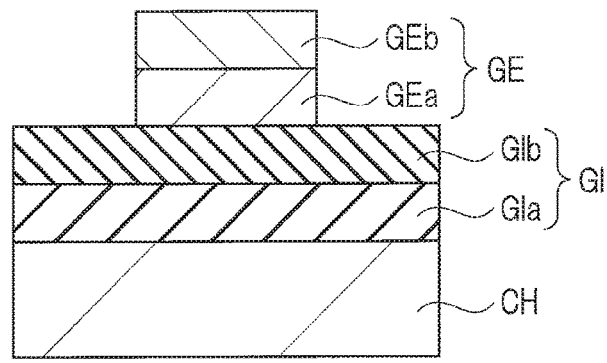
FIG. 1 is a cross-sectional view illustrating a configuration of a semiconductor device of a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and so forth (including number of pieces, values, amount, range, and the like).

Also, components having the same function are denoted by the same reference symbols throughout the drawings for describing the embodiments, and the repetitive description thereof is omitted. Further, when a plurality of analogous parts (portions) are present, a sign is added to a collective reference to indicate an individual or a specific part. In addition, the description of the same or similar portions is not repeated in principle unless particularly required in the following embodiments.

In addition, in the drawings referred to in the embodiments, hatching may be omitted even in a cross-sectional view. Also, in some drawings used in the embodiments, hatching is added even in a plan view so as to make the drawings easy to see.

Further, in the cross-sectional views and plan views, the size of each part is not correspondent to an actual device and the size of a particular par may be illustrated relatively large to facilitate understanding of the drawing. Moreover, in a case in which a cross-sectional view and a plan view are correspondent, the size of a particular par may be illustrated relatively large to facilitate understanding of the drawing.

First Embodiment

Hereinafter, a semiconductor device of the present embodiment will be described in details referring to the drawings.

[Description of Structure]

Figure 2:
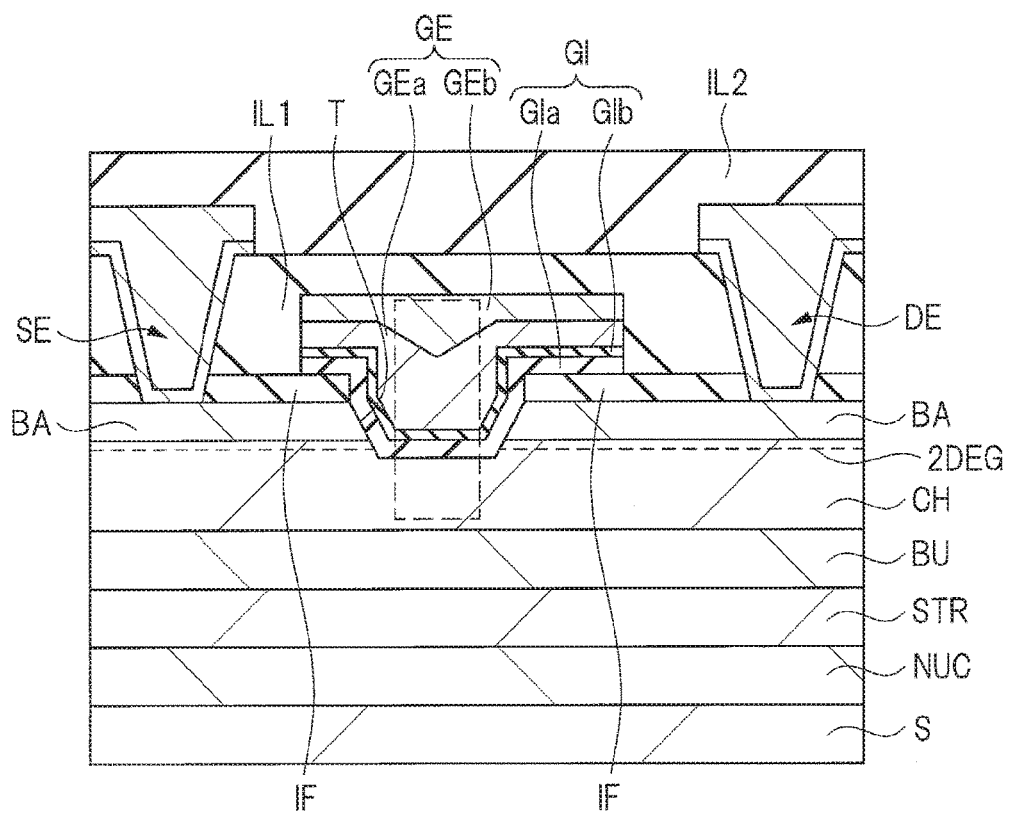
FIG. 2 is a cross-sectional view illustrating another configuration of the semiconductor device of the first embodiment.
Figure 3:
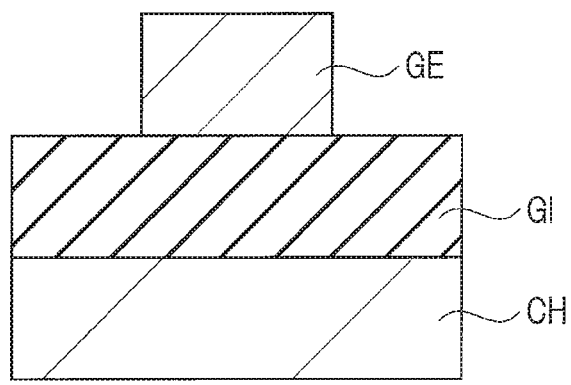
FIG. 3 is a cross-sectional view illustrating a configuration of a semiconductor device of the comparative example 1 of the first embodiment.
Figure 4:
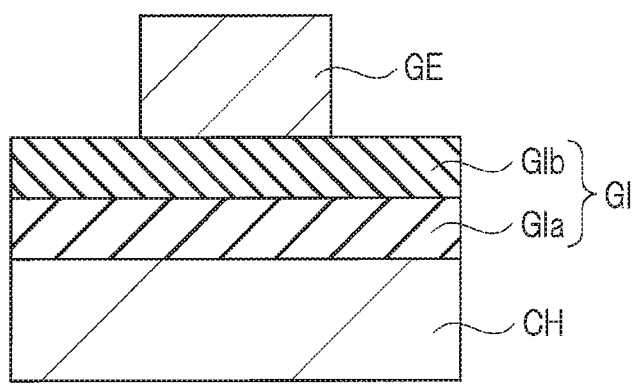
FIG. 4 is a cross-sectional view illustrating the configuration of a semiconductor device of the comparative example 2 of the first embodiment.

FIG. 1 is a cross-sectional view illustrating a configuration of a semiconductor device of the present embodiment. The semiconductor device illustrated in FIG. 1 is a metal insulator semiconductor (MIS) type field effect transistor (FET) using a nitride semiconductor. FIG. 1 is, for example, a diagram schematically illustrating the configuration in the rectangular portion surrounded by a broken line in FIG. 2. FIG. 2 is a cross-sectional view illustrating another configuration of the semiconductor device of the present embodiment. The semiconductor device as illustrated in FIG. 2 will be detailed in a second embodiment. FIG. 3 is a cross-sectional view illustrating a configuration of a semiconductor device of a comparative example 1 of the present embodiment. FIG. 4 is a cross-sectional view illustrating a configuration of a semiconductor device of a comparative example 2 of the present embodiment.

As illustrated in FIG. 1, the semiconductor device of the present embodiment has a gate electrode GE disposed on a channel layer CH formed of a nitride semiconductor via a gate insulating film GI.

Herein, the gate insulating film GI has a first gate insulating film GIa formed on the channel layer CH and a second gate insulating film GIb formed on the first gate insulating film GIa. And, the gate electrode GE has a first gate electrode GEa formed on the second gate insulating film GIb and a second gate electrode GEb formed on the first gate electrode GEa.

Hereinafter, the gate insulating film GI (GIa, GIb) and the gate electrode GE (GEa, GEb) will be described.

As previously described, the gate insulating film GI has the first gate insulating film GIa formed on the channel layer CH and the second gate insulating film GIb formed on the first gate insulating film GIa. The first gate insulating film GIa is formed of an oxide of a first metal (an oxide containing the first metal, an oxide film of the first metal). The second gate insulating film GIb is formed of an oxide of a second metal (an oxide containing the second metal, an oxide film of the second metal). And, the electronegativity of the second metal is lower than the electronegativity of the first metal.

Moreover, the first gate insulating film GIa is not a film formed by thermally oxidizing the channel layer (nitride semiconductor) CH, but is a film formed by a so-called deposition method.

The first metal is, for example, aluminum (Al). In this case, the oxide of the first metal is aluminum oxide ($Al_2O_3$).

The second metal is one or more elements selected from the group of Hf, Zr, Ta, Ti, Nb, La, Y and Mg. In this case, the oxide of the second metal is, for example, hafnium oxide ($HfO_2$), zirconium oxide ($ZrO_2$), tantalum oxide ($Ta_2O_5$), titanium oxide ($TiO_2$), niobium oxide ($Nb_2O_5$), lanthanum oxide ($La_2O_3$), yttrium oxide ($Y_2O_3$) or magnesium oxide (MgO). The composition ratio of the second metal to oxygen is not limited to the above. Moreover, two or more elements may be contained as the second metal. In this case, there will be a compound of two kinds of metals and oxygen. However, in this case, the electronegativities of both of the two or more elements must be lower than the electronegativity of the first metal. However, it is inevitable to contain a metal as an impurity (e.g., a concentration of the metal is 0.01% or less) upon the manufacture, and thus a metal impurity may be sometimes contained irrespective of the magnitude of the electronegativity.

As previously described, the gate electrode GE has the first gate electrode GEa formed on the second gate insulating film GIb and the second gate electrode GEb formed on the first gate electrode GEa.

The first gate electrode GEa is a nitride of a third metal. As the third metal, Ti, Ta, W or the like can be used. In this case, the nitride of the third metal (a nitride containing the third metal, a nitride film of the third metal) is TiN, TaN or WN. The third metal is preferably one having conductivity, high processability and low oxygen absorbability and suppliability. In this respect, it is suitable to use Ti as the third metal.

The second gate electrode GEb is formed of a fourth metal. As the fourth metal, W, Ru or Ir can be used. The fourth metal is preferably one which has conductivity even after oxidation, has high processability and blocks entry of oxygen into the first gate electrode GEa of the lower layer. In this respect, it is suitable to use W as the fourth metal.

By thus stacking the oxides of both of the first metal and the second metal with different electronegativities to be used as the gate insulating film GI and disposing the oxide film of the second metal with lower electronegativity at the upper layer, a threshold voltage (Vth) can be positive (Vth>0) (stacking effect of the gate insulating film).

Moreover, by stacking the nitride containing the third metal and the fourth metal to be used as the gate electrode GE and disposing the fourth metal at the upper layer, the diffusion of oxygen to the gate insulating film GI can be prevented and variations in the threshold voltage (Vth) can be reduced. In particular, even after the annealing treatment described later, the diffusion of oxygen can be reduced and the stacking effect of the gate insulating film can be maintained.

For the nitride film (MN) of the third metal, N/M, the ratio (stoichiometric ratio) of the nitrogen (N) to the third metal (M), is preferably 1 or more. By thus setting N/M, the ratio (stoichiometric ratio) of the nitrogen (N) to the third metal (M), to be greater than 1 (nitrogen-rich), nitrogen (N) is bound to dangling bonds that can occur in a grain boundary between grains and grains and the reactivity with oxygen (also referred to as oxygen incorporation) can be reduced. The ratio of the nitrogen (N) to the third metal (M) can be measured by, for example, X-ray photoelectron spectroscopy (XPS). According to the studies by the inventor, when a titanium nitride film (TiN film) is used as the nitride film (MN) of the third metal, N/Ti, the ratio of N to Ti in TiN, can be a maximum of about 1.2. Thus, it is preferable to set $1<N/Ti\leq1.2$.

The film thickness of the fourth metal is preferably 50 nm or more. As previously described, the fourth metal has a role of preventing the diffusion of oxygen from the surface of the gate electrode GE to the first gate electrode GEa. If the fourth metal (the second gate electrode GEb) with a film thickness of about 50 nm is stacked on the first gate electrode GEa, the oxygen concentration at the surface of the gate electrode GE can be lowered by about one digit at the surface of the first gate electrode GEa. By thus setting the film thickness of the fourth metal (e.g., a tungsten film (W film)) to 50 nm or more, the diffusion of oxygen to the first gate electrode GEa can be effectively suppressed.

For example, when a single layer of an aluminum oxide film is used as the gate insulating film GI in the comparative example 1 (FIG. 3), the threshold voltage (Vth) is negative (Vth<0). The negative (Vth<0) threshold voltage (Vth) causes a normally-on state. By contrast, as in the comparative example 2 illustrated in FIG. 4, of the gate insulating film GI, when aluminum oxide ($Al_2O_3$) is used as the first gate insulating film GIa and hafnium oxide (HfO$_2$) is used as the second gate insulating film GIb of the upper layer thereof, the threshold voltage (Vth) can be positive (Vth>0) since Hf has lower electronegativity than Al (stacking effect of the gate insulating film).

This is due to the polarization effect caused by the stacking of Al$_2$O$_3$ and HfO$_2$, in which oxygen electrons in the gate insulating film are attracted to the elements with higher electronegativity. That is, a flat band Vfb becomes large (positive (Vfb>0)) corresponding to this polarization, and the threshold voltage (Vth) can be positive (Vth>0) corresponding to this flat band Vfb.

However, according to the studies by the inventor, when a layer (e.g., a gate electrode and wires (including a source electrode and a drain electrode)) is formed above the gate insulating films (Al$_2$O$_3$ and HfO$_2$), damage is applied in the gate insulating films (Al$_2$O$_3$ and HfO$_2$) due to the plasma and charged particles generated upon the film formation, and traps (trap levels, defects) may occur. This damage is sometimes referred to as charge-up damage. In particular, when a layer is formed above the gate insulating films (Al$_2$O$_3$ and HfO$_2$) by a PVD method (sputtering method or the like), the damage applied to the gate insulating films (Al$_2$O$_3$ and HfO$_2$) is large and the threshold voltage (Vth) is decreased (Vth<0) under the influence of these traps (trap levels, defects).

Thereupon, heat treatment (also referred to as annealing, annealing treatment, post annealing, and recovery annealing) is effective for recovery of this damage, that is, reduction in the traps (trap levels, defects). That is, by performing the heat treatment after a layer (e.g., a gate electrode and wires (including a source electrode and a drain electrode)) is formed above the gate insulating films (Al$_2$O$_3$ and HfO$_2$), the threshold voltage (Vth) is increased again and can be positive (Vth>0).

However, according to the experiments by the inventor, it turned out that the degree of the recovery varied such that the flat band Vfb recovered to Vfb>0 in some cases and the flat band Vfb remained at Vfb<0 in other cases.

The inventor has diligently studied the causes of the variations in the degree of the recovery of the above flat band Vfb and conducted the following experiment using a semiconductor device of the aforementioned comparative example 2 (FIG. 4) as one of the experiments to pursue the causes. A device 1 was created as follows: a first gate insulating film (Al$_2$O$_3$) GIa and a second gate insulating film (HfO$_2$) GIb were stacked and then annealed in an atmosphere in which oxygen was added to inert gas; and Au was formed by a resistance heating vacuum deposition method as a gate electrode GE on the gate insulating film GI. A device 2 was created as follows: a first gate insulating film GIa and a second gate insulating film GIb were stacked and annealed in an atmosphere with only inert gas; and Au was formed by a resistance heating vacuum deposition method as a gate electrode GE on the gate insulating film GI. Note that, upon the deposition of Au, a metal mask (shadow mask) was used to form the gate electrode. According to this deposition of Au, the influence of the charge-up damage can be avoided and the influence of oxygen in the annealing atmosphere can be tested.

The C-V characteristics of the device 1 and device 2 were measured, and Vfb was examined. As a result, in the device 1 in which the annealing was performed in the atmosphere in which oxygen was added to inert gas, the flat band Vfb remained at Vfb<0. On the other hand, in the device 2 in which the annealing was performed in the atmosphere with only inert gas, the flat band Vfb recovered to Vfb>0.

According to various studies including the above experiment, it turned out that the polarization of oxygen formed at the interface between the first gate insulating film GIa and the second gate insulating film GIb was destroyed or the degree of the polarization was reduced by the oxygen in the annealing atmosphere, and the shift effect of the flat band Vfb based on this polarization effect was reduced.

In particular, when TiN is used for the gate electrode GE and TiN is taken out into the air after the film formation and annealed, oxygen entered into the TiN film or oxygen adsorbed on the surface of the TiN film is diffused in the film. Moreover, water molecules entered into the TiN film are also diffused in the film. It is considered that the oxygen (oxygen elements) diffused in this TiN film destroys the aforementioned polarization formed in the gate insulating film and eliminates this polarization effect.

By contrast, according to the semiconductor device (FIG. 1) of the present embodiment, the nitride containing the third metal and the fourth metal are stacked to be used as the gate electrode GE, and the fourth metal is disposed at the upper layer. Thus, the diffusion of oxygen to the gate insulating film GI can be prevented, the polarization of oxygen (stacking effect of the gate insulating film) can be maintained, and the shift effect of the flat band Vfb can be maintained. Therefore, the threshold voltage (Vth) can be positive (Vth>0). Moreover, the variations in the threshold voltage (Vth) can be corrected. In particular, even when the annealing treatment (e.g., heat treatment at 500° C. or higher) is performed after the gate insulating film GI is formed, the diffusion of oxygen by the annealing treatment can be reduced and the stacking effect of the gate insulating film can be maintained.

Next, the effect of suppressing the diffusion of oxygen by the second gate electrode GEb will be described. The following experiment was conducted as one of the experiments to test this effect of suppressing the diffusion of oxygen.

As a sample 1 (TiN (as)), a TiN film was formed on a Si substrate by a sputtering method. And, as a sample 2 (TiN (anneal)), a TiN film was formed on a Si substrate by a sputtering method, and this TiN film was annealed under the conditions corresponding to the aforementioned recovery annealing.

And, as a sample 3 (W/TiN (as)), a TiN film was formed on a Si substrate by a sputtering method, and a W film was successively formed on the TiN film. And, as a sample 4 (TiN (anneal)), a TiN film was formed on a Si substrate by a sputtering method, a W film was successively formed on the TiN film, and this stacked film of the TiN film and the W film was annealed under the conditions corresponding to the aforementioned recovery annealing.

The distributions of the oxygen concentrations in these samples (samples 1 to 4) were measured. For the measurement, a secondary ion mass spectrometry (SIMS) method was used.

Figure 5:
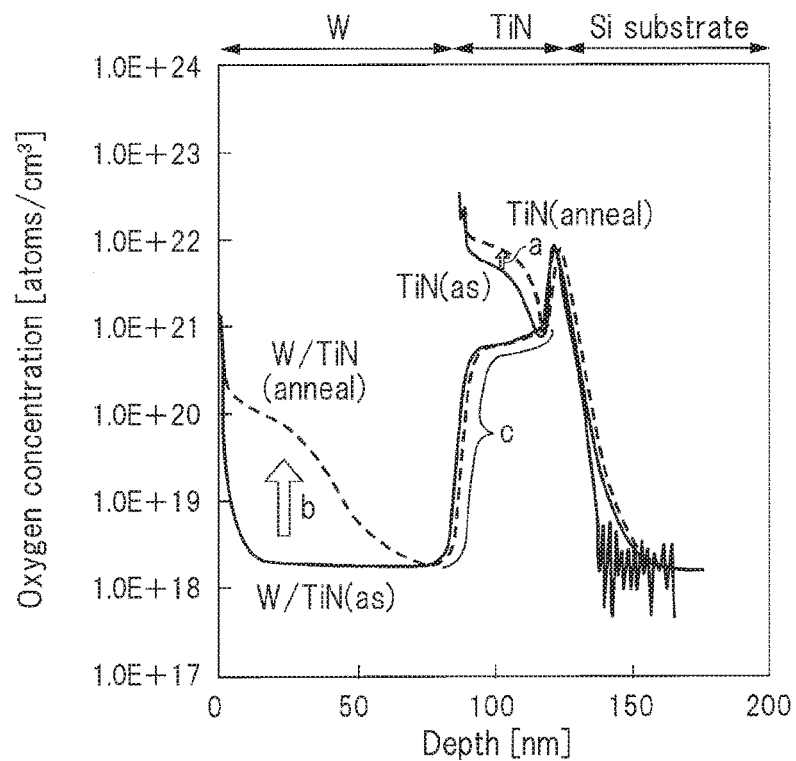
FIG. 5 is a diagram illustrating distributions of oxygen concentrations in samples 1 to 4.
Figure 5:
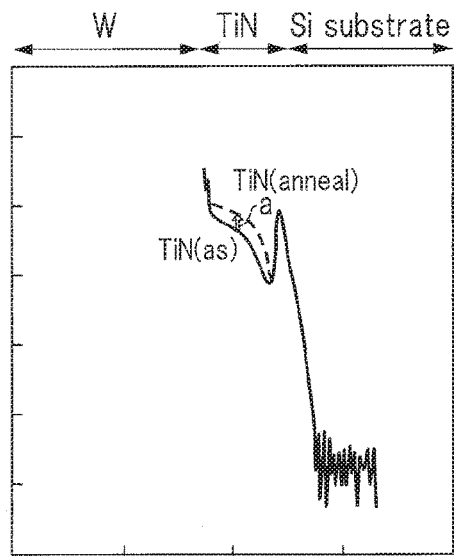
Figure 5:
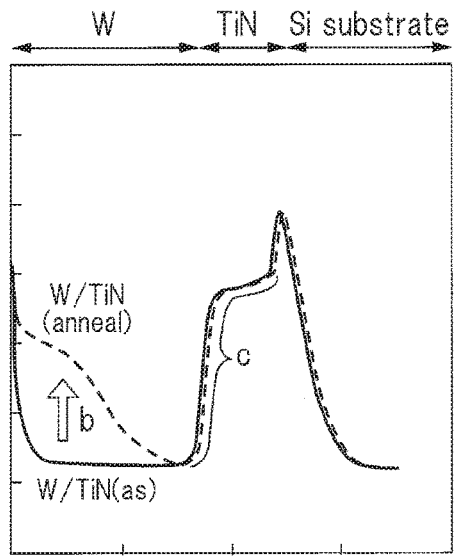

FIG. 5 shows the distributions of the oxygen concentrations in each of the samples. FIG. 5(a) is a graph showing the oxygen concentrations in the four samples (samples 1 to 4) all together, FIG. 5(b) is a graph showing only the samples 1 and 2, and FIG. 5(c) is a graph showing only the samples 3 and 4. In FIG. 5, the horizontal axis represents the depth (depth, [nm]), and the vertical axis represents the oxygen concentration (oxygen concentration [atoms/cm$^3$]). For example, 1.0E+17 represents 1.0×10$^{17}$. Note that the starting points of the depths of the TiN films (samples 1 and 2) in FIG. 5 are shifted by the film thickness (about 90 nm) of the W film to be written. Moreover, the peaks observed at the positions of 120 nm in depth, that is, the positions corresponding to the boundaries between the TiN film and the Si substrate are due to natural oxide films on the Si substrates.

As illustrated in FIGS. 5(a) and (b), the oxygen concentrations in the TiN film are higher in the sample 2 (TiN (anneal)) than in the sample 1 (TiN (as)) (see the portion indicated by the arrow a). By contrast, as illustrated in FIGS. 5(a) and (c), in the sample 3 (W/TiN (as)) and the sample 4 (W/TiN (anneal)), although the oxygen concentrations in the W films are high (see the portion indicated by the arrow b), the lines of the samples 3 and 4 are overlapped at the depths of 75 nm and further, which are the lower parts of the W films (see the portion c), and no increase in the oxygen concentrations could have been confirmed. Moreover, the oxygen concentrations at the surfaces of the TiN films are suppressed low in the samples 3 and 4, compared to the samples 1 and 2.

From the above results, it turned out that, in the samples 3 and 4 in which the stacked gate electrode structure of the present embodiment is used, oxygen and water molecules adsorbed on the surface of the second gate electrode GEb were not diffused to the TiN films, the first gate electrodes GEa, even after the annealing. Thus, the shift effect of the flat band Vfb by the polarization formed in the gate insulating film GI can be maintained.

Herein, a study on the film thickness of the second gate electrode GEb is conducted to prevent the diffusion of oxygen to the TiN film, the first gate electrode GEa. For example, in FIG. 5, it is confirmed that the oxygen concentrations decreased by one digit at a film thickness of about 50 nm in the W films. It is considered that the diffusion of oxygen to the TiN films is considerably suppressed when the oxygen concentrations at the surfaces are decreased by one digit. Thus, it is considered that the film thickness of the second gate electrode GEb is sufficiently effective at about 50 nm.

Moreover, as previously described, by making the TiN film nitrogen-rich, that is, by setting N/Ti, the ratio of to Ti in the TiN film, to greater than 1, dangling bonds that can occur in the grain boundary can be passivated by nitrogen (N). This can suppress the adsorptions of oxygen and water molecules upon exposure to the atmosphere. On the other hand, when the TiN film is Ti-rich, oxygen in such as $HfO_2$, the second gate electrode GEb, moves to the first gate electrode GEa and oxygen deficiency (oxygen vacancy) is generated in the second gate electrode GEb. This oxygen vacancy has a positive charge and shifts the flat band Vfb to the negative. Therefore, when the TiN film is nitrogen-rich, this shift of the flat band Vfb to the negative side can be suppressed.

[Description of Manufacturing Method]

Next, referring to FIGS. 6 to 11, a manufacturing method of the semiconductor device of the present embodiment will be described as well as the configuration of the semiconductor device will be more apparent. FIGS. 6 to 11 are cross-sectional views showing steps of manufacturing the semiconductor device of the present embodiment.

Figure 6:
FIG. 6 is a cross-sectional view illustrating a step of manufacturing the semiconductor device of the first embodiment.

As illustrated in FIG. 6, the substrate on which the channel layer CH is formed is prepared. The channel layer CH is a nitride semiconductor layer, and, for example, a gallium nitride layer (GaN layer) is used. A GaN substrate is used as the substrate, and this substrate may be used as the channel layer CH. Alternatively, a GaN layer may be formed on a supporting substrate such as a Si substrate. For example, an i-GaN layer is heteroepitaxially grown on a Si substrate by a metal organic chemical vapor deposition (MOCVD) method or the like. At this time, the growth is performed without intentionally doping impurities.

First, the surface of the channel layer (i-GaN layer, GaN substrate) CH is washed using a diluted HCl solution or the like. Subsequently, the gate insulating film GI having the first gate insulating film GIa and the second gate insulating film GIb is formed on the channel layer CH.

Figure 7:
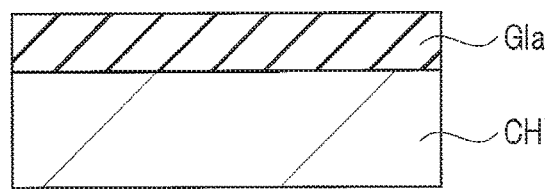
FIG. 7 is a cross-sectional view illustrating a step of manufacturing the semiconductor device of the first embodiment and is a cross-sectional view illustrating the manufacturing step continued from FIG. 6.

First, as illustrated in FIG. 7, the first gate insulating film (the oxide film of the first metal) GIa is formed on the channel layer CH. For example, an aluminum oxide film ($Al_2O_3$ film) is deposited as the first gate insulating film GIa by using a deposition method. For example, an aluminum oxide film ($Al_2O_3$ film) with a film thickness of about 50 nm to 100 nm is deposited by an ALD method using trimethylaluminum ($Al(CH_3)_3$, TMA) and $H_2O$ (oxidizing agent) as source gases in an atmosphere of 400° C. According to the ALD method, a film with good controllability, good coatability and good film quality can be formed. Note that ozone ($O_3$) may be used as the oxidizing agent besides $H_2O$. Note that the aluminum oxide film ($Al_2O_3$ film) may be formed by using an oxygen plasma CVD method besides the ALD method.

Next, heat treatment is performed. For example, the heat treatment is performed for about one minute at 750° C. in a nitrogen ($N_2$) atmosphere. This heat treatment reduces the traps (trap levels, defects) in the first gate insulating film GIa (herein, the aluminum oxide film). In particular, when aluminum oxide is formed on GaN by a deposition method, the trap density in the film becomes high and hysteresis of the capacitance-voltage characteristics (C-V characteristics) is often observed. This hysteresis of the C-V characteristics means, for example, that the C-V waveforms measured while a voltage is increased from −10 V to +10 V and the C-V waveforms measured while a voltage is decreased from +10 to −10 V are not the same and the waveforms do not overlap. Thus, by performing the heat treatment, the trap density can be reduced, and the hysteresis can be improved.

Figure 8:
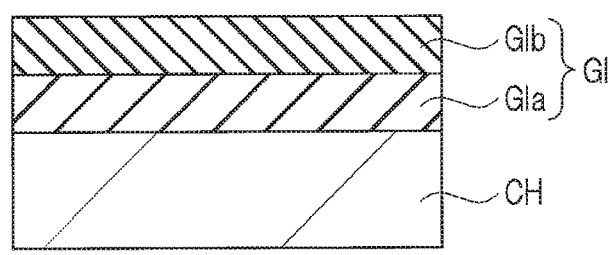
FIG. 8 is a cross-sectional view illustrating a step of manufacturing the semiconductor device of the first embodiment and is a cross-sectional view illustrating the manufacturing step continued from FIG. 7.

Next, as illustrated in FIG. 8, for example, a hafnium oxide film ($HfO_2$ film) is formed as the second gate insulating film (the oxide film of the second metal) GIb on the first gate insulating film GIa (herein, the aluminum oxide film). For example, the hafnium oxide film is deposited by a reactive sputtering method using a Hf metal target and a mixed gas of argon (Ar) and oxygen ($O_2$).

The film thickness of the hafnium oxide film can be adjusted within a range of, for example, about 1 to 10 nm. However, according to the studies by the inventor, a sufficient shift effect of the flat band Vfb can be obtained by the aforementioned polarization of oxygen even with a film thickness of 2 to 3 nm. The reactive sputtering method is a type of PVD method. To form the second gate insulating film GIb, an ALD method or a CVD method may be used besides the physical vapor deposition (PVD) method.

Next, heat treatment is performed. For example, the heat treatment is performed for about one minute at 750° C. in a nitrogen ($N_2$) atmosphere. This heat treatment reduces the traps (trap levels, defects) in the second gate insulating film GIb (herein, the hafnium oxide film). Note that, although the heat treatment after the first gate insulating film GIa (aluminum oxide film) is formed and the heat treatment after the second gate insulating film GIb (hafnium oxide film) is formed are separately performed in the above steps, the heat treatment after the first gate insulating film GIa is formed may be omitted and the heat treatment may be collectively performed after the stacked film of the first gate insulating film GIa (aluminum oxide film) and the second gate insulating film GIb (hafnium oxide film) is formed.

Thus, the gate insulating film GI having the stacked film of the first gate insulating film GIa (aluminum oxide film) and the second gate insulating film GIb (hafnium oxide film) is formed.

Figure 9:
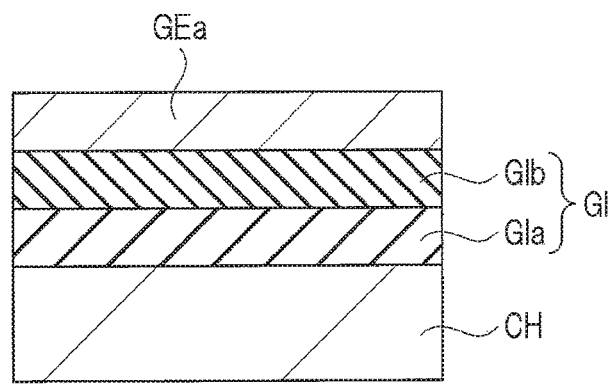
FIG. 9 is a cross-sectional view illustrating a step of manufacturing the semiconductor device of the first embodiment and is a cross-sectional view illustrating the manufacturing step continued from FIG. 8.
Figure 10:
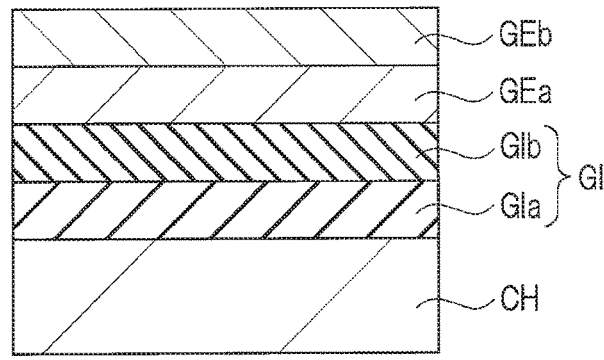
FIG. 10 is a cross-sectional view illustrating a step of manufacturing the semiconductor device of the first embodiment and is a cross-sectional view illustrating the manufacturing step continued from FIG. 9.

Next, the gate electrode GE is formed on the gate insulating film GI. For example, as illustrated in FIGS. 9 and 10, a titanium nitride film (TiN film) is formed as the first gate electrode GEa, and a tungsten film (W film) is further formed thereon as the second gate electrode GEb. For example, a titanium nitride film of about 20 nm is deposited on the second gate insulating film GIb by a reactive sputtering method using a Ti metal target and a mixed gas of argon (Ar) and nitrogen ($N_2$). Subsequently, as illustrated in FIG. 10, a tungsten film of about 100 nm is deposited on the first gate electrode GEa by a sputtering method using a W metal target and argon (Ar) gas. Between the step of forming the TiN film and the step of forming the W film, it is preferable to successively perform these steps without exposure to the air. By performing vacuum transport between the TiN film forming apparatus and the W film forming apparatus, the films can be successively formed without exposure to the air. As a film forming method, an ALD method or a CVD method may be used besides the PVD method such as the above sputtering method. Moreover, a film forming method of the second gate insulating film GIb is also not limited to the PVD method.

However, by using a multi-target sputtering apparatus, the films can be successively formed easily. In this apparatus, the film type can be easily changed by disposing a plurality of targets in the reaction-processing chamber and switching the shutters. Thus, the films can be successively formed without complicating the device configuration and manufacturing steps and without exposure to the air. Therefore, the apparatus is suitable for use in forming the stacked film of W film/TiN film.

By thus successively forming the films without exposure to the air, an amount of oxygen incorporated into the surface of the first gate electrode GEa can be reduced and the diffusion of oxygen can be suppressed. As a result, the polarization of oxygen (stacking effect of the gate insulating film) is maintained, and the shift effect of the flat band Vfb can be maintained.

Moreover, as previously described, it is confirmed that the oxygen concentrations decrease by one digit when the film thickness of the second gate electrode (W film) GEb is about 50 nm. Thus, the film thickness of the second gate electrode (W film) GEb is preferably 50 nm or more. Furthermore, it is preferable to form a W film with a film thickness of 100 nm or more when the heat treatment (recovery annealing) is performed after the steps of forming the second gate electrode (W film) GEb and then exposing the second gate electrode GEb to the atmosphere. In addition, the upper limit of the film thickness of the second gate electrode (W film) GEb is, for example, about 500 nm.

Next, heat treatment is performed. This heat treatment is a heat treatment for reducing the traps (trap levels, defects) in the gate insulating films ($Al_2O_3$ and $HfO_2$) caused by the plasma and charged particles generated upon the film formation of the gate electrode GE. As the heat treatment conditions, optimum temperature, time and the like may be selected depending on the PVD conditions (e.g., power and time) of the first gate electrode GEa and the second gate electrode GEb. According to the studies by the inventor, the heat treatment is preferably performed with the temperature within a range of 400° C. to 600° C. and the time within a range of 10 minutes to 60 minutes. And, as the heat treatment atmosphere, for example, an atmosphere of inert gas such as nitrogen ($N_2$) is preferably used.

Figure 11:
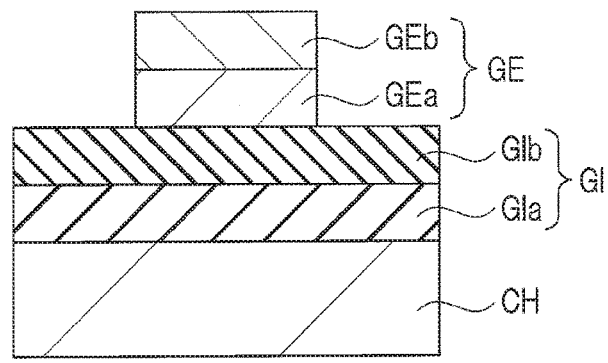
FIG. 11 is a cross-sectional view illustrating a step of manufacturing the semiconductor device of the first embodiment and is a cross-sectional view illustrating the manufacturing step continued from FIG. 10.

Next, as illustrated in FIG. 11, the stacked film of the titanium nitride film and the tungsten film is patterned (processed) by using a photolithography technique and an etching technique, thereby forming the gate electrode GE (the first gate electrode GEa and the second gate electrode GEb) with desired shapes. The second gate electrode GEb covers an entirety of the upper surface of the first gate electrode GEa. Note that, upon the etching of this gate electrode GE, the gate insulating film GI of the lower layer may be etched. Moreover, the above heat treatment may be performed after this patterning step.

The gate electrode GE having the stacked film of the first gate electrode GEa and the second gate electrode GEb is thus formed. In addition, as a material of the first gate electrode GEa, for example, TaN, WN or the like, which enables easy gate etching, may be used. As the second gate electrode GEb, for example, Ru, Ir or the like may be used.

As described above, according to the present embodiment, the oxide film of the first metal and the oxide film of the second metal having lower electronegativity than the first metal are stacked and used as the gate insulating films, and thereby the threshold voltage (Vth) can be shifted in a positive direction.

Moreover, the nitride containing the third metal and the fourth metal are stacked to be used as the gate electrode GE, and the fourth metal is disposed at the upper layer. Thus, the diffusion of oxygen to the gate insulating film GI can be prevented, the polarization of oxygen (stacking effect of the gate insulating film) can be maintained, and the shift effect of the flat band Vfb can be maintained. Therefore, the threshold voltage (Vth) can be positive (Vth>0). Moreover, the variations in the threshold voltage (Vth) can be corrected. In particular, even when the annealing treatment is performed after the gate insulating film GI is formed, the diffusion of oxygen by the annealing treatment can be reduced and the stacking effect of the gate insulating film can be maintained.

Furthermore, an example, in which the gate insulating film and the gate electrode can be applied as parts of the semiconductor device illustrated in FIG. 2, has been described in the present embodiment. However, the gate insulating film and gate of the present embodiment can be applied to a different type of semiconductor device. A part of this application example will be described in the second embodiment and sixth embodiment, which will be described later.

(Summary)

Figure 12:
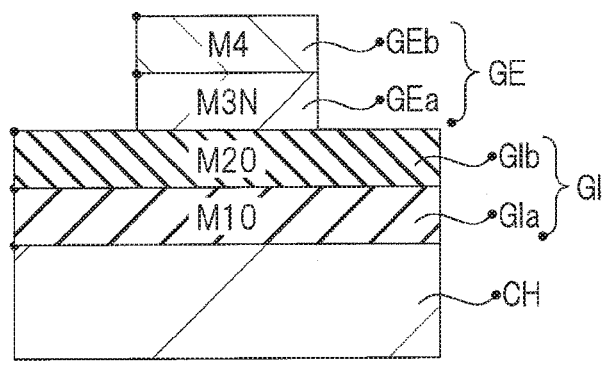
FIG. 12 is a cross-sectional view illustrating a characteristic configuration of the semiconductor device of the first embodiment.

Referring to FIG. 12, the characteristic configuration of the semiconductor device of the present embodiment will be described below altogether. FIG. 12 is a cross-sectional view illustrating the characteristic configuration of the semiconductor device of the present embodiment.

As illustrated in FIG. 12, the semiconductor device of the present embodiment has the gate electrode GE formed on the channel layer (nitride semiconductor) CH via the gate insulating film GI.

<About Gate Insulating Film>

The gate insulating film GI has an oxide film M1O of a first metal M1 formed on the channel layer (nitride semiconductor) CH and an oxide film M2O of a second metal M2 formed on the oxide film M1O. It is needless to say that the composition ratio of M1 to O and the composition ratio of M2 to O change depending on the elements selected.

And, the electronegativity of the second metal M2 is lower than the electronegativity of the first metal M1. The first metal M1 and the second metal M2 are selected from Group 2, Group 3, Group 4, Group 5 and Group 13 in the Periodic Table of Pauling electronegativity). For the first metal M1 and the second metal M2, it is particularly preferable that the oxides thereof exist as solids at a device operating range temperature (e.g., <200° C.) and have a good insulating property in thin films. Among these metals, a combination of an oxide film of the lower layer and an oxide film of the upper layer may be selected based on the relationship of electronegativity.

As the first metal M1, that is, the metal (element) constituting the oxide film of the lower layer, Al is preferred. Note that Si (Group 14) may be used as described later in the undermentioned third embodiment and the like. When the surface of the nitride semiconductor is oxidized upon the formation of the oxide of the first metal, an interface oxide layer with a low insulating property is formed and the characteristics of the gate insulating film are impaired. The above Al oxide, that is, aluminum oxide is suitable for use as the lower layer since this interface reaction layer is difficult to be formed even when aluminum oxide is formed on the nitride semiconductor (particularly, GaN).

<About Gate Electrode>

The gate electrode GE has a nitride M3N of a third metal M3 formed on the gate insulating film GI and a fourth metal M4 formed on the nitride M3N of the third metal M3.

The above metals (M3, M3N, M4) suitable for use in the present embodiment are collectively shown in Table 1 below.

TABLE 1

| metal OR METAL COMPOUND | |
|---|---|
| M3 | Ti, Ta, W |
| M3N | TiN, TaN, WN |
| M4 | W, Ru, Ir |

Moreover, as previously described, the composition ratio of N to M3, N/M3, is preferably greater than 1. Furthermore, the film thickness of M4 is preferably 50 nm or more.

Second Embodiment

Hereinafter, a semiconductor device of the present embodiment will be detailed referring to the drawings.

[Description of Structure]

Figure 13:
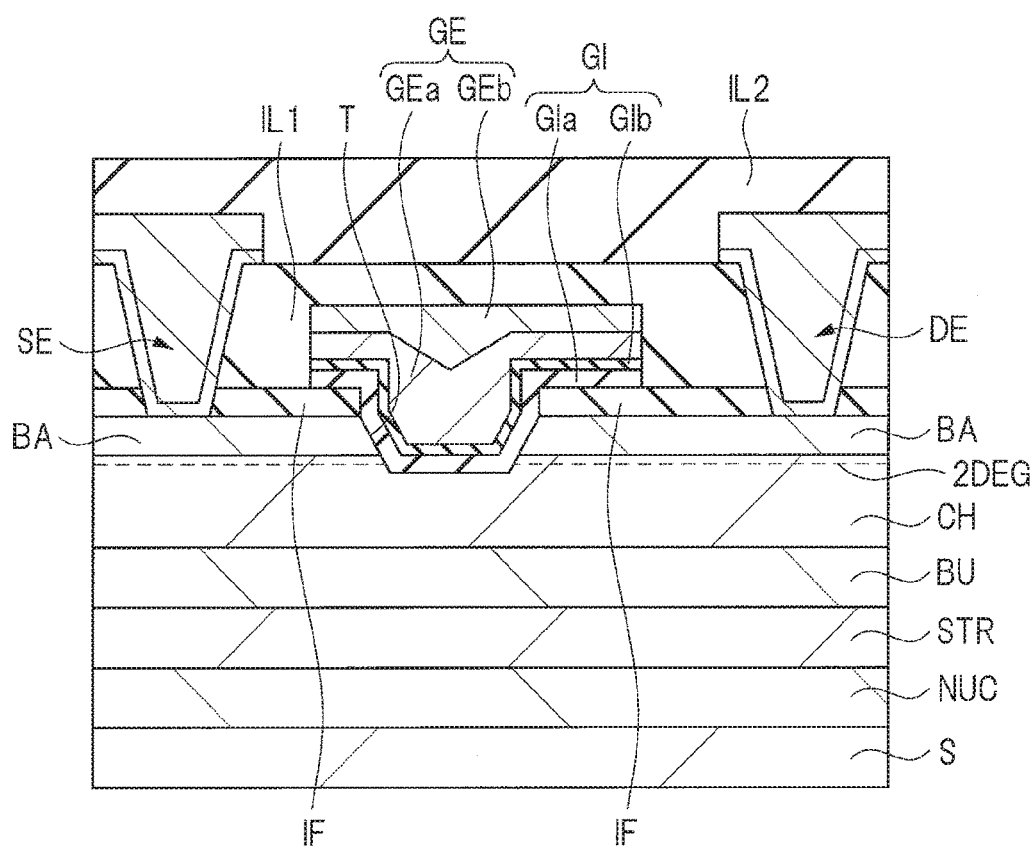
FIG. 13 is a cross-sectional view illustrating a configuration of a semiconductor device of a second embodiment.

FIG. 13 is a cross-sectional view illustrating a configuration of the semiconductor device of the present embodiment. The semiconductor device illustrated in FIG. 13 is a MISFET using a nitride semiconductor. This semiconductor device is also called a high electron mobility transistor (HEMT) or a power transistor. The semiconductor device of the present embodiment is a so-called recessed-gate type semiconductor device.

The semiconductor device of the present embodiment has a plurality of nitride semiconductor layers formed on a substrate S. Specifically, a nucleation layer NUC, a strain relaxation layer STR, a buffer layer BU, a channel layer (also referred to as an electron transit layer) CH and a barrier layer BA are sequentially formed on the substrate S. A gate electrode GE penetrates an insulating film IF and the barrier layer BA and is formed, via a gate insulating film GI, inside a groove T (also referred to as a trench or a recess) formed by digging a part of the channel layer CH.

Herein, the gate insulating film GI has a first gate insulating film GIa formed on the channel layer CH and a second gate insulating film GIb formed on the first gate insulating film GIa and is formed of the same material as the gate insulating film (the first gate insulating film GIa, the second gate insulating film GIb) described in the first embodiment. That is, the first gate insulating film GIa is formed of an oxide of the first metal. The second gate insulating film GIb is formed of an oxide of the second metal. And, the electronegativity of the second metal is lower than the electronegativity of the first metal. The first gate insulating film GIa is not a film formed by thermally oxidizing the channel layer (nitride semiconductor) CH, but a film formed by a so-called deposition method. That is, the oxide film of the first metal of the lower layer is not an oxide of an element constituting the nitride semiconductor layer. Thus, since the oxide film of the first metal is not formed by direct oxidation of the channel layer (nitride semiconductor), the first metal is different from the element constituting the channel layer (nitride semiconductor).

Herein, the gate electrode GE has a first gate electrode GEa formed on the channel layer CH and a second gate electrode GEb formed on the first gate electrode GEa and is formed of the same material as the gate electrode (the first gate electrode GEa, the second gate electrode GEb) described in the first embodiment. That is, the first gate electrode GEa is formed of a nitride of the third metal (a nitride containing the third metal, a nitride film of the third metal). The second gate electrode GEb is formed of the fourth metal. And, N/M3, the composition ratio of nitrogen (N) to the third metal (M3) in the nitride of the third metal, is preferably greater than 1. Moreover, the film thickness of the fourth metal is preferably 50 nm or more.

In addition, a source electrode SE and a drain electrode DE are formed on the barrier layers BA at both sides of the gate electrode GE.

As illustrated in FIG. 13, the nucleation layer NUC is formed on the substrate S, and the strain relaxation layer STR is formed on the nucleation layer NUC. The nucleation layer NUC is formed to generate crystal nuclei for the layers formed thereon, such as the strain relaxation layer STR or the like, to grow. Moreover, the nucleation layer NUC is formed to prevent the transformation of the substrate S caused by the diffusion of the constituent elements (e.g., Ga or the like) of the layers, which are formed above the nucleation layer NUC, from the layers formed above to the substrate S. And, the strain relaxation layer STR is formed to relax the stress on the substrate S and suppress the occurrences of warpages and cracks in the substrate S.

The buffer layer BU is formed on this strain relaxation layer STR, the channel layer (also referred to as an electron transit layer) CH formed of a nitride semiconductor is formed on the buffer layer BU, and the barrier layer BA formed of a nitride semiconductor is formed on the channel layer CH. The source electrode SE and the drain electrode DE are formed on the barrier layer BA at both sides of the gate electrode GE. The source electrode SE and the drain electrode DE are both ohmically connected to the barrier layer BA. Moreover, an insulating layer IL1 is formed on the gate electrode GE. Of this insulating layer IL1, the insulating layer IL1 in the formation region of the source electrode SE and the formation region of the drain electrode DE is removed, and contact holes are formed. Conductive films are embedded in these contact holes, and the source electrode SE and the drain electrode DE are constituted by these conductive film. An insulating layer IL2 is formed on the source electrode SE and the drain electrode DE.

Herein, in the semiconductor device of the present embodiment, a two-dimensional electron gas 2DEG is produced in the vicinity of the interface between the channel layer CH and the barrier layer BA, closer to the channel layer. Moreover, when a positive voltage (threshold voltage) is applied to the gate electrode GE, a channel is formed in the vicinity of the interface between the gate electrode GE and the channel layer CH.

The above two-dimensional electron gas 2DEG is formed by the following mechanism. Each of the nitride semiconductors (herein, gallium nitride based semiconductors) constituting the channel layer CH and the barrier layer BA has a different forbidden band width (band gap) and electron affinity. Thus, square well potentials are produced at the joint surfaces of these semiconductors. By accumulating electrons in these square well potentials, the two-dimensional electron gas 2DEG is produced in the vicinity of the interface between the channel layer CH and the barrier layer BA.

And, the two-dimensional electron gas 2DEG formed in the vicinity of the interface between the channel layer CH and the barrier layer BA is divided by the groove T in which the gate electrode GE is formed. Thus, in the semiconductor device of the present embodiment, on/off can be switched depending on the presence or absence of the formation of the channel.

Moreover, in the present embodiment, the stacked film of the oxide of the first metal and the oxide of the second metal, which has lower electronegativity than the first metal and is disposed thereon, is used as the gate insulating film GI. Thus, the flat band voltage (Vfb) can be shifted in the positive direction as in the case of the first embodiment. This can shift the threshold voltage (Vth) in the positive direction. Then, by adjusting an amount of the shift, the threshold voltage (Vth) can be positive (Vth>0), and the normally-off characteristics can be enhanced.

Moreover, by stacking the nitride containing the third metal and the fourth metal to be used as the gate electrode GE and disposing the fourth metal at the upper layer, the diffusion of oxygen to the gate insulating film GI can be prevented and the variations in the threshold voltage (Vth) can be reduced, as in the case of the first embodiment. In particular, even after the annealing treatment described later, the diffusion of oxygen can be reduced and the stacking effect of the gate insulating film can be maintained.

Furthermore, by setting N/M3, the composition ratio of nitrogen (N) to the third metal (M3) in the nitride of the third metal, to greater than 1, the same effect as in the first embodiment can be exerted. And, by setting the film thickness of the fourth metal to 50 nm or more, the same effect as in the first embodiment can be exerted.

[Description of Manufacturing Method]

Next, referring to FIGS. 14 to 25, a manufacturing method of the semiconductor device of the present embodiment will be described as well as the configuration of the semiconductor device will be more apparent. FIGS. 14 to 25 are cross-sectional views showing steps of manufacturing the semiconductor device of the present embodiment.

Figure 14:
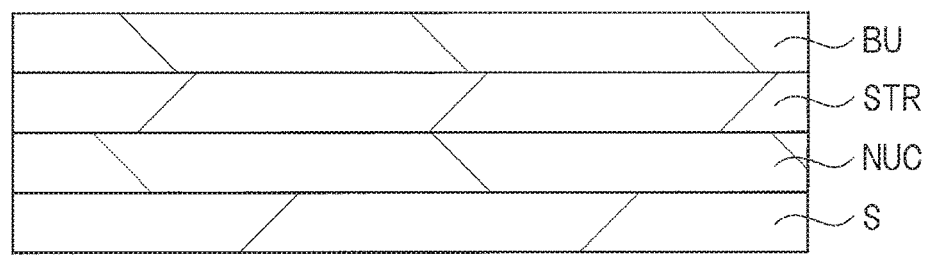
FIG. 14 is a cross-sectional view illustrating a step of manufacturing the semiconductor device of the second embodiment.

As illustrated in FIG. 14, as the substrate S, for example, a semiconductor substrate formed of silicon (Si) having a (111) surface exposed is used, and, as the nucleation layer NUC, for example, an aluminum nitride (AlN) layer is heteroepitaxially grown on the substrate S by using a metal organic chemical vapor deposition method or the like. Subsequently, as the strain relaxation layer STR, a superlattice structure formed by repeatedly stacking a stacked film (AlN/GaN film) of a gallium nitride (GaN) layer and an aluminum nitride (AlN) layer is formed on the nucleation layer NUC. For example, both a gallium nitride (GaN) layer and an aluminum nitride (AlN) layer are repeatedly heteroepitaxially grown up to about 100 layers (200 layers in total) with film thicknesses of about 2 to 3 nm by using a metal organic chemical vapor deposition method or the like. Note that, as the substrate S, a substrate formed of SiC, sapphire or the like may be used besides the above silicon.

Next, the buffer layer BU is formed on the strain relaxation layer STR. As the buffer layer BU, for example, an AlGaN layer is heteroepitaxially grown on the strain relaxation layer STR by using a metal organic chemical vapor deposition method or the like.

Figure 15:
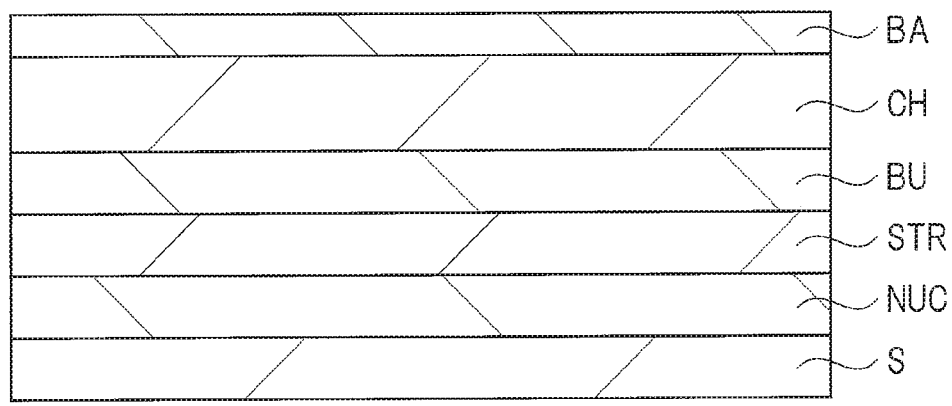
FIG. 15 is a cross-sectional view illustrating a step of manufacturing the semiconductor device of the second embodiment and is a cross-sectional view illustrating the manufacturing step continued from FIG. 14.

Subsequently, as illustrated in FIG. 15, the channel layer CH is formed on the buffer layer BU. For example, a gallium nitride layer (i-GaN layer) is heteroepitaxially grown on the buffer layer BU. At this time, the growth is performed without intentionally doping impurities. The electron affinity of this channel layer CH is larger than the electron affinity of the buffer layer BU. Moreover, this channel layer CH is a nitride semiconductor with a narrower band gap than the buffer layer BU.

Next, as the barrier layer BA, for example, an AlGaN layer is heteroepitaxially grown on the channel layer CH by using a metal organic chemical vapor deposition method or the like. The electron affinity of this barrier layer BA is smaller than the electron affinity of the channel layer CH. Moreover, this barrier layer BA is a nitride semiconductor with a broader band gap than the channel layer CH.

The stacked body of the buffer layer BU, the channel layer CH and the barrier layer BA is thus formed. This stacked body is formed by the above heteroepitaxial growth, that is, Group-III plane growth stacked in a [0001] crystal axis (C axis) direction. In other words, the above stacked body is formed by (0001) Ga plane growth. In this stacked body, the two-dimensional electron gas 2DEG is produced in the vicinity of the interface between the channel layer CH and the barrier layer BA.

Figure 16:
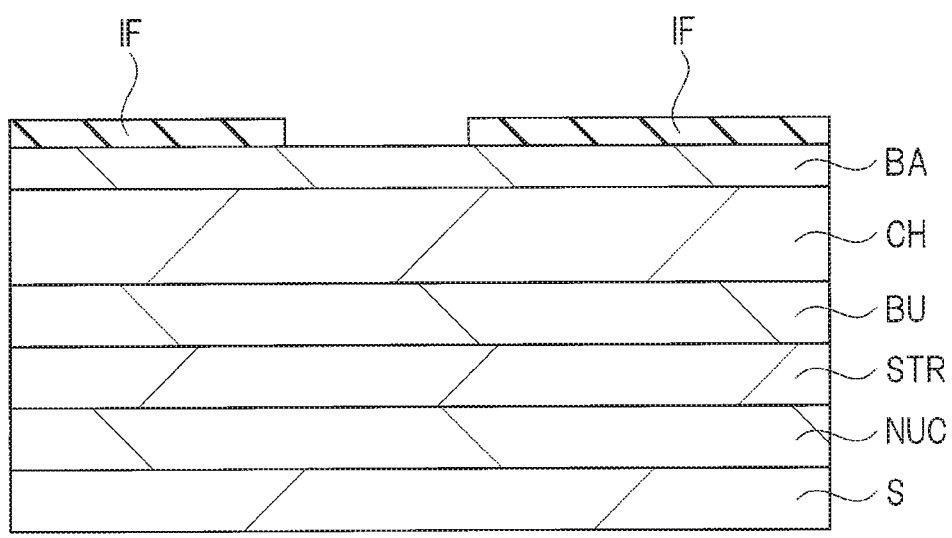
FIG. 16 is a cross-sectional view illustrating a step of manufacturing the semiconductor device of the second embodiment and is a cross-sectional view illustrating the manufacturing step continued from FIG. 15.

Next, as illustrated in FIG. 16, the insulating film IF having an opening is formed on the barrier layer BA. For example, as the insulating film IF, a silicon nitride film is deposited on the barrier layer BA by a thermal CVD method or the like. Subsequently, the opening is formed in the insulating film IF by using a photolithography technique and an etching technique.

Figure 17:
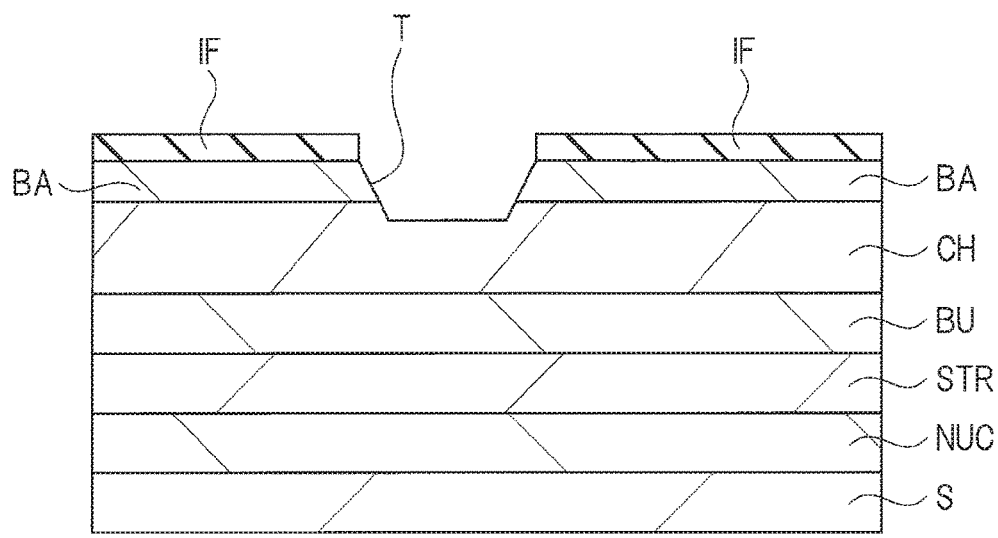
FIG. 17 is a cross-sectional view illustrating a step of manufacturing the semiconductor device of the second embodiment and is a cross-sectional view illustrating the manufacturing step continued from FIG. 16.

Next, by using the insulating film IF as a mask, the barrier layer BA and the channel layer CH are etched to form the groove T which penetrates the insulating film IF and the barrier layer BA and reaches a part of the channel layer CH (FIG. 17). After this etching, heat treatment may be performed to recover the etching damage.

Figure 18:
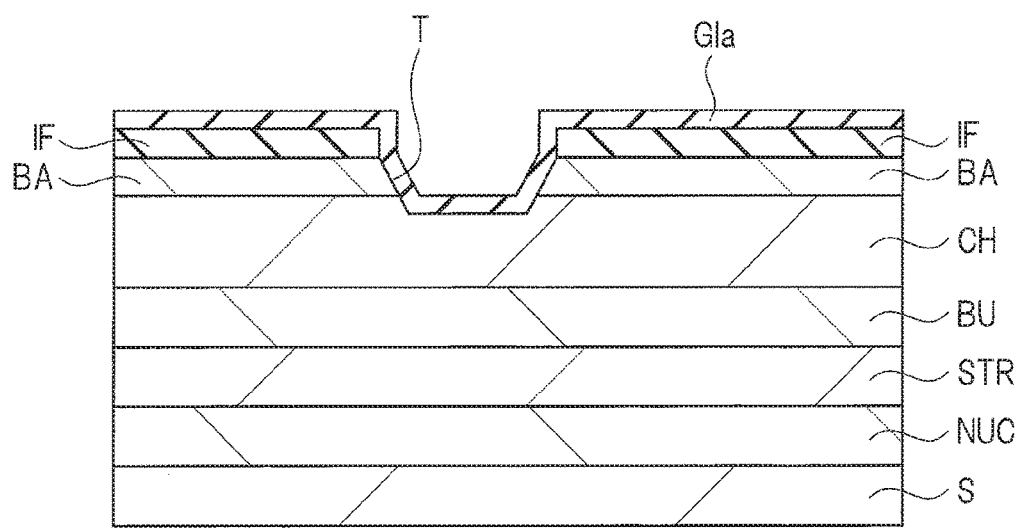
FIG. 18 is a cross-sectional view illustrating a step of manufacturing the semiconductor device of the second embodiment and is a cross-sectional view illustrating the manufacturing step continued from FIG. 17.
Figure 19:
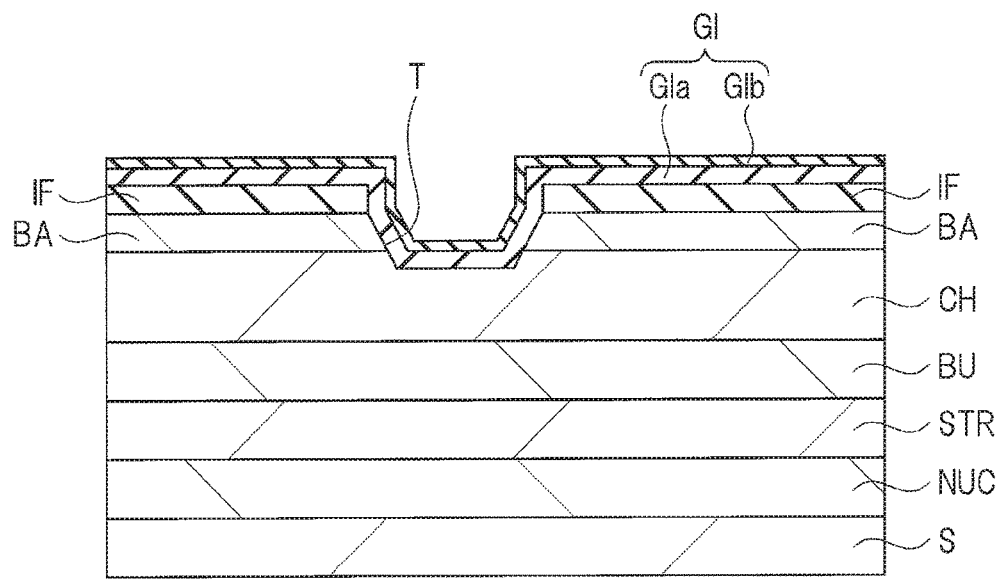
FIG. 19 is a cross-sectional view illustrating a step of manufacturing the semiconductor device of the second embodiment and is a cross-sectional view illustrating the manufacturing step continued from FIG. 18.

Subsequently, as illustrated in FIGS. 18 and 19, the gate insulating film GI having the first gate insulating film GIa and the second gate insulating film GIb is formed inside the groove T and on the insulating film IF. For example, the first gate insulating film GIa is formed inside the groove T, in which the channel layer CH is exposed at the bottom thereof, and on the insulating film IF. For example, as the first gate insulating film GIa, an aluminum oxide film ($Al_2O_3$ film) is deposited on the bottom surface and side walls of the groove T and on the insulating film IF (FIG. 18). Specifically, after the surface of the substrate S is washed with a diluted HCl solution, for example, an aluminum oxide film ($Al_2O_3$ film) with a film thickness of about 50 nm to 100 nm is deposited inside the groove T and on the insulating film IF by an ALD method using trimethylaluminum ($Al(CH_3)_3$, TMA) and $H_2O$ (oxidizing agent) as source gases in an atmosphere of 400° C. According to the ALD method, a film can be formed with good controllability of the film thickness and good coatability even on the irregular surfaces. Note that ozone ($O_3$) may be used as the oxidizing agent besides $H_2O$.

Next, heat treatment is performed. For example, the heat treatment is performed for about one minute at 750° C. in a nitrogen ($N_2$) atmosphere. This heat treatment reduces the traps (trap levels, defects) in the first gate insulating film GIa (herein, the aluminum oxide film). In particular, when aluminum oxide is formed on GaN by a deposition method, the trap density in the film becomes high and hysteresis of C-V characteristic becomes large. Thus, by performing the heat treatment, the trap density can be reduced.

Next, as illustrated in FIG. 19, for example, a hafnium oxide film ($HfO_2$ film) is formed as the second gate insulating film GIb on the first gate insulating film GIa (herein, the aluminum oxide film). For example, the hafnium oxide film is deposited by a reactive sputtering method using a Hf metal target and a mixed gas of argon (Ar) and oxygen ($O_2$). The film thickness of the hafnium oxide film varies depending on the threshold voltage (Vth), but is preferably about 1 to 10 nm. The reactive sputtering method is a type of PVD method. To form the second gate insulating film GIb, an ALD method or a CVD method may be used besides the PVD method.

Next, heat treatment is performed. For example, the heat treatment is performed for about one minute at 750° C. in a nitrogen ($N_2$) atmosphere. This heat treatment reduces the traps (trap levels, defects) in the second gate insulating film GIb (herein, the hafnium oxide film). Note that, although the heat treatment after the first gate insulating film GIa (aluminum oxide film) is formed and the heat treatment after the second gate insulating film GIb (hafnium oxide film) is formed are separately performed in the above steps, the heat treatment after the first gate insulating film GIa is formed may be omitted and the heat treatment may be collectively performed after the stacked film of the first gate insulating film GIa (aluminum oxide film) and the second gate insulating film GIb (hafnium oxide film) is formed.

Thus, the gate insulating film GI having the stacked film of the first gate insulating film GIa (aluminum oxide film) and the second gate insulating film GIb (hafnium oxide film) is formed.

Figure 20:
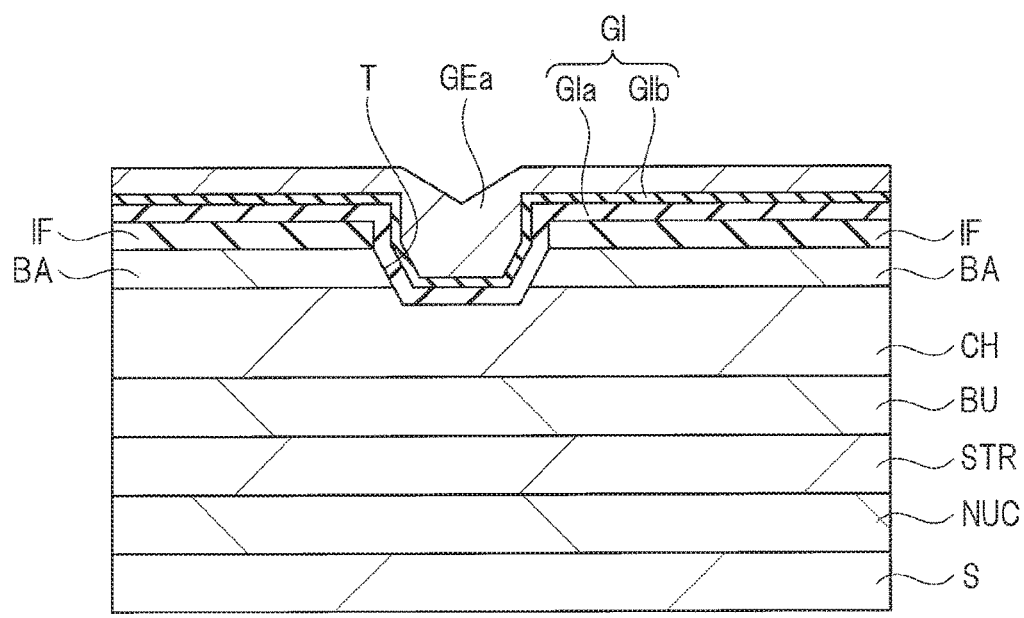
FIG. 20 is a cross-sectional view illustrating a step of manufacturing the semiconductor device of the second embodiment and is a cross-sectional view illustrating the manufacturing step continued from FIG. 19.
Figure 21:
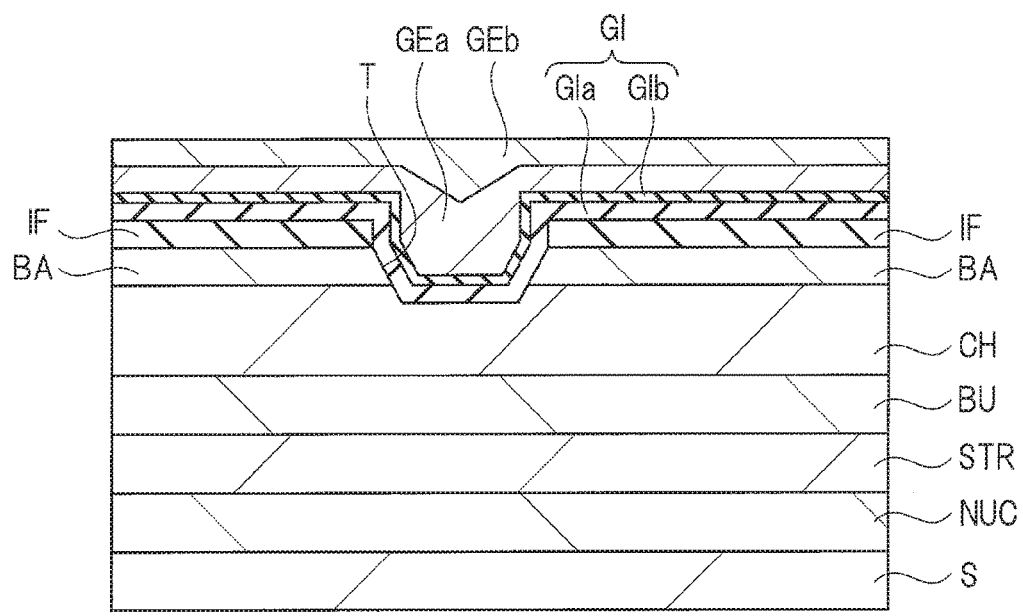
FIG. 21 is a cross-sectional view illustrating a step of manufacturing the semiconductor device of the second embodiment and is a cross-sectional view illustrating the manufacturing step continued from FIG. 20.

Next, as illustrated in FIGS. 20 and 21, the gate electrode GE is formed on the gate insulating film GI. For example, a titanium nitride film (TiN film) is formed as the first gate electrode GEa, and a tungsten film (W film) is further formed thereon as the second gate electrode GEb. These stacked films are successively formed using a multi-target sputtering apparatus. For example, a titanium nitride film of about 20 nm is deposited on the second gate insulating film GIb by a reactive sputtering method using a Ti metal target and a mixed gas of argon (Ar) and nitrogen ($N_2$). At this time, N/Ti, the ratio of N to Ti in the TiN film to be formed, is set to greater than 1. The proportion of N in the TiN film can be controlled by adjusting the amount of nitrogen in the mixed gas of argon (Ar) and nitrogen ($N_2$).

Subsequently, as illustrated in FIG. 21, a tungsten film with a film thickness of about 100 nm is deposited on the first gate electrode GEa by a sputtering method using a W metal target and argon (Ar) gas.

Next, heat treatment is performed. This heat treatment is a heat treatment for reducing the traps (trap levels, defects) in the gate insulating films ($Al_2O_3$ and $HfO_2$) caused by the plasma and charged particles generated upon the film formation of the gate electrode GE. As the heat treatment conditions, optimum temperature, time and the like may be selected depending on the PVD conditions (e.g., power and time) of the first gate electrode GEa and the second gate electrode GEb. According to the studies by the inventor, the heat treatment is preferably performed with the temperature within a range of 400° C. to 600° C. and the time within a range of 10 minutes to 60 minutes. And, as the heat treatment atmosphere, for example, an atmosphere of inert gas such as nitrogen ($N_2$) is preferably used.

Figure 22:
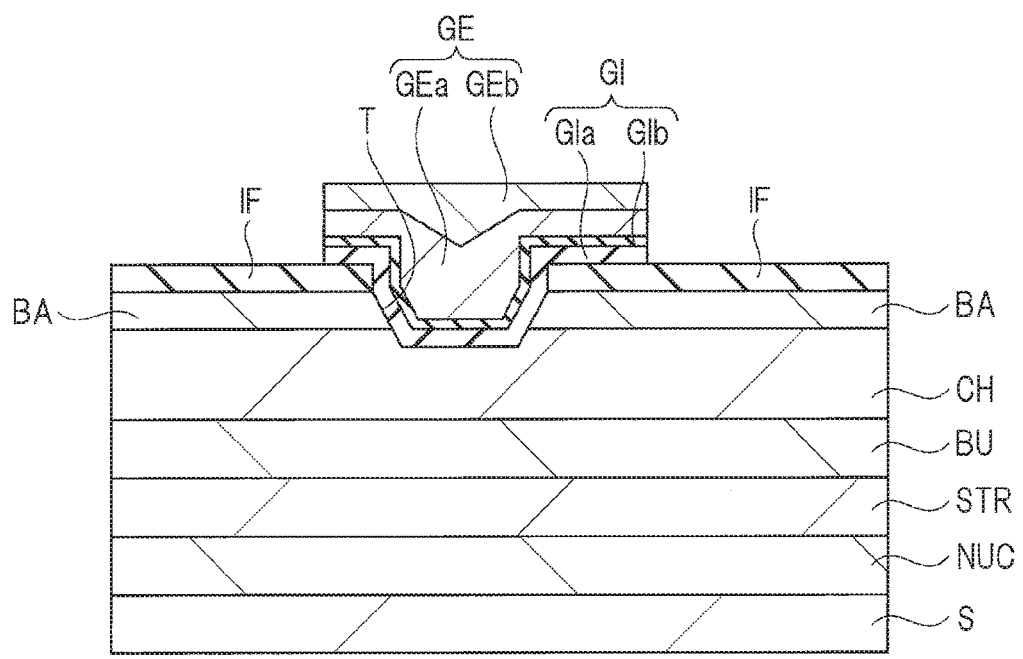
FIG. 22 is a cross-sectional view illustrating a step of manufacturing the semiconductor device of the second embodiment and is a cross-sectional view illustrating the manufacturing step continued from FIG. 21.

Subsequently, as illustrated in FIG. 22, the stacked film of the titanium nitride film and the tungsten film is patterned (processed) by using a photolithography technique and an etching technique, thereby forming the gate electrode GE. Upon the etching of the gate electrode GE, the gate insulating film GI of the lower layer is also etched. Note that the above heat treatment may be performed after this patterning step.

The gate electrode GE having the stacked film of the first gate electrode GEa and the second gate electrode GEb is thus formed. In addition, as a material of the first gate electrode GEa, for example, TaN, WN or the like, which enables easy gate etching, may be used. As the second gate electrode GEb, for example, Ru, Ir or the like may be used.

Figure 23:
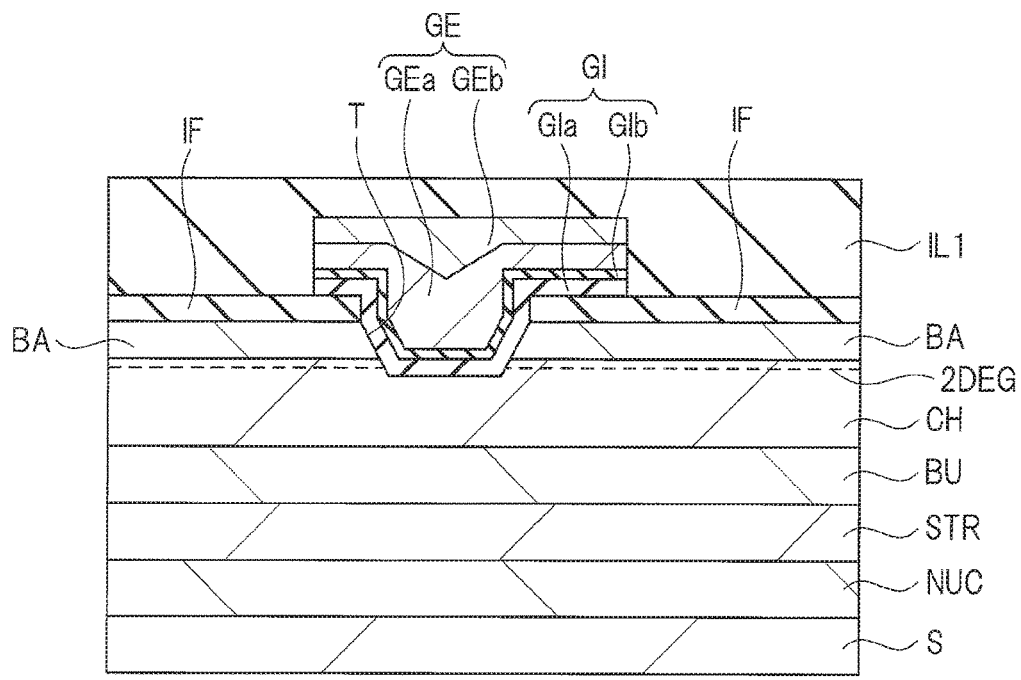
FIG. 23 is a cross-sectional view illustrating a step of manufacturing the semiconductor device of the second embodiment and is a cross-sectional view illustrating the manufacturing step continued from FIG. 22.
Figure 24:
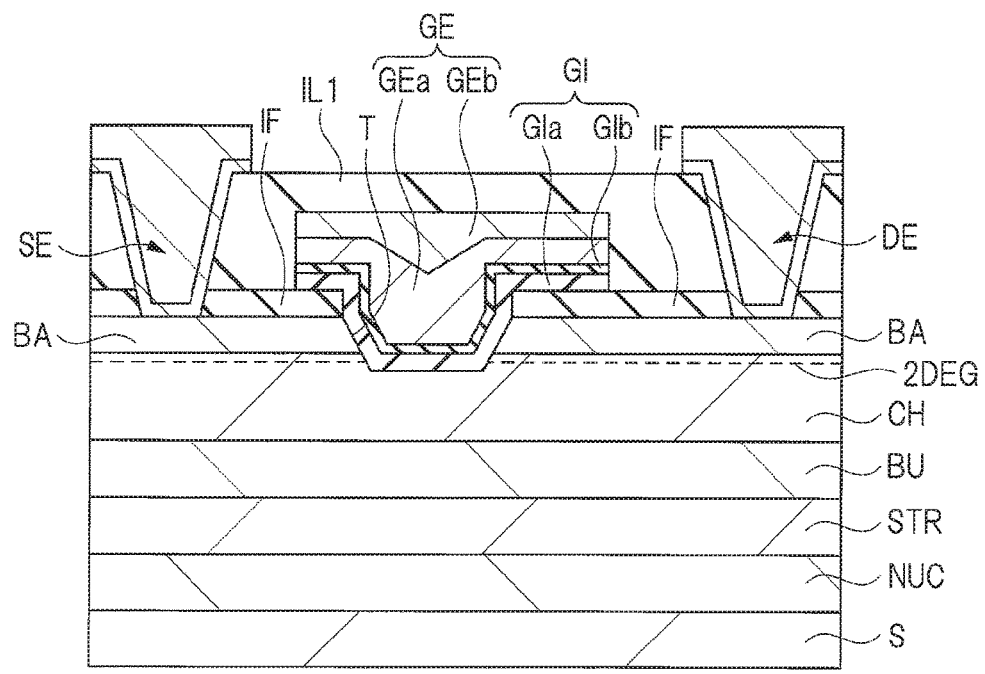
FIG. 24 is a cross-sectional view illustrating a step of manufacturing the semiconductor device of the second embodiment and is a cross-sectional view illustrating the manufacturing step continued from FIG. 23.

Next, as illustrated in FIG. 23, for example, a silicon oxide film is formed as the insulating layer IL1 on the gate electrode GE and the insulating film IF by using a CVD method or the like. Subsequently, as illustrated in FIG. 24, by using a photolithography technique and an etching technique, the insulating layer IL1 and the insulating film IF in the formation region of the source electrode SE and the formation region of the drain electrode DE are removed by etching to form the contact holes. Next, the source electrode SE and the drain electrode DE are formed on the barrier layer BA at both sides of the gate electrode GE. For example, a conductive film is formed on the insulating layer IL1 including the insides of the contact holes. For example, as the conductive film, a stacked film (Al/TiN) constituted by a titanium nitride (TiN) film and an aluminum (Al) film thereon is formed by a sputtering method or the like. Next, the above stacked film (Al/TiN) is patterned by using a photolithography technique and an etching technique, and heat treatment is performed, for example, for about 30 minutes at 550° C. By this heat treatment, contacts at interfaces between the barrier layer BA (nitride semiconductor film) and the source electrode SE and the drain electrode DE become ohmic contacts. Moreover, the charge-up damage to the gate insulating film GI upon the film formation of the conductive film can be resolved.

Figure 25:
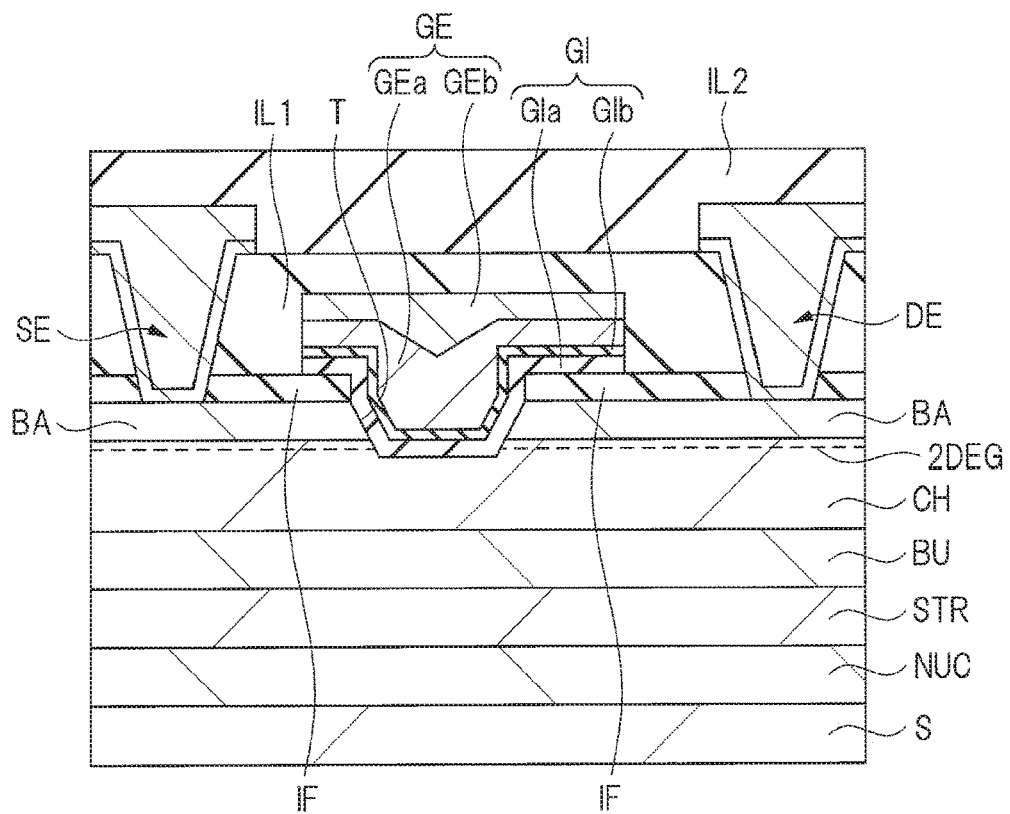
FIG. 25 is a cross-sectional view illustrating a step of manufacturing the semiconductor device of the second embodiment and is a cross-sectional view illustrating the manufacturing step continued from FIG. 24.

Thereafter, the insulating layer (also referred to as a cover film or surface protective film) IL2 is formed on the insulating layer IL1 including the source electrode SE and the drain electrode DE. As the insulating layer IL2, for example, a silicon oxynitride (SiON) film is deposited by using a CVD method or the like (FIG. 25).

By the above steps, the semiconductor device of the present embodiment can be formed.

As described above, according to the present embodiment, like the case of the first embodiment, the oxide film of the first metal and the oxide film of the second metal having lower electronegativity than the first metal are stacked and used as the gate insulating films, and thereby the threshold voltage (Vth) can be shifted in a positive direction. Then, by adjusting an amount of the shift, the normally-off operation, in which the threshold voltage (Vth) is set to be positive (Vth>0), can be achieved.

Moreover, the nitride containing the third metal and the fourth metal are stacked to be used as the gate electrode GE, and the fourth metal is disposed at the upper layer. Thus, the diffusion of oxygen to the gate insulating film GI can be prevented, the polarization of oxygen (stacking effect of the gate insulating film) can be maintained, and the shift effect of the flat band Vfb can be maintained. Therefore, the threshold voltage (Vth) can be positive (Vth>0). Moreover, the variations in the threshold voltage (Vth) can be corrected. In particular, even when the annealing treatment is performed after the gate insulating film GI is formed, the diffusion of oxygen by the annealing treatment can be reduced and the stacking effect of the gate insulating film can be maintained.

Figure 26:
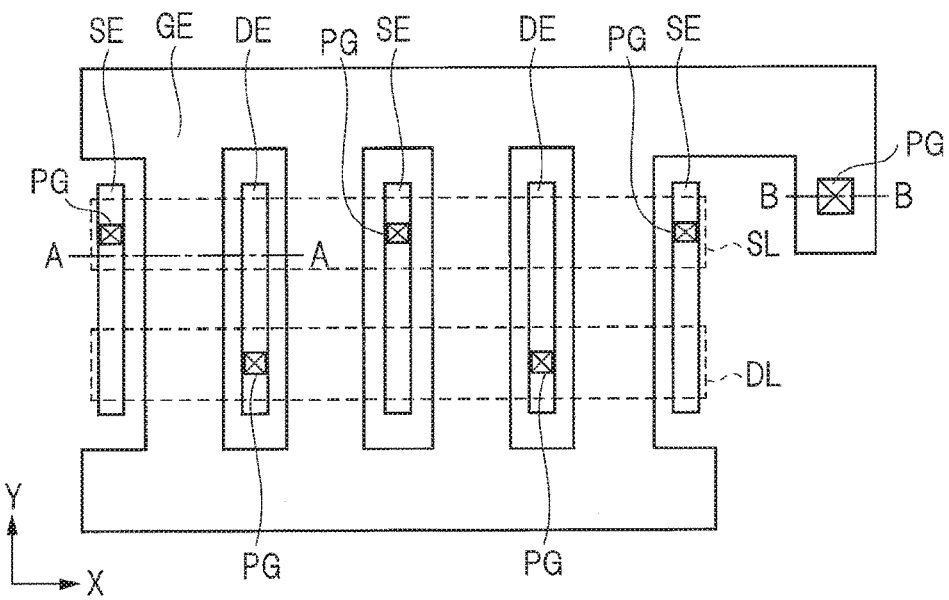
FIG. 26 is one example of a plan view illustrating the configuration of the semiconductor device of the second embodiment.

The layout of the above gate electrode GE, source electrode SE and drain electrode DE is not limited, but these electrodes are disposed, for example, as illustrated in FIG. 26. FIG. 26 is one example of a plan view illustrating the configuration of the semiconductor device of the present embodiment. For example, FIG. 13 corresponds to the A-A cross section in FIG. 26. The source electrodes SE and the drain electrodes DE are, for example, linear shapes extending in the Y direction. In other words, they are rectangular shapes (quadrangular shapes) having long sides in the Y direction. The source electrodes SE and the drain electrodes DE are disposed alternately in parallel in the X direction. Then, the gate electrodes GE are disposed between the source electrodes SE and the drain electrodes DE. For example, one ends (the upper side in the drawing) of the plurality of the gate electrodes (GE), which have linear shapes and extend in the Y direction, are connected to a line (also referred to as agate line) extending in the X direction. And, the other ends (the lower side in the drawing) of the plurality of the gate electrodes (GE), which have linear shapes and extend in the Y direction, are connected to a line (also referred to as a gate line) extending in the X direction. Note that one of the two lines (also referred to as gate lines) extending in the X direction may be omitted and the gate electrodes GE may have pectinate shapes. Meanwhile, the plurality of the source electrodes SE are connected to, via plugs (connections) PG, a source line SL extending in the X direction. And, the plurality of the drain electrodes DE are connected to, via plugs (connections) PG, a drain line DL extending in the X direction. Note that the source electrodes SE and the source line SL may be disposed in the same layer. For example a line extending in the X direction (corresponding to the source line portion) and source electrodes, which have linear shapes and extend in the Y direction, may be connected to be in a shape (pectinate shape). Likewise, the drain electrodes DE and the drain line DL may be disposed in the same layer. For example a line extending in the X direction (corresponding to the drain line portion) and drain electrodes, which have linear shapes and extend in the Y direction, may be connected to be in a shape (pectinate shape). Thus, the layout of the gate electrodes GE, the source electrodes SE, the drain electrodes DE and other wires can be changed as necessary, and the number of wire layers is also not limited.

Figure 27:
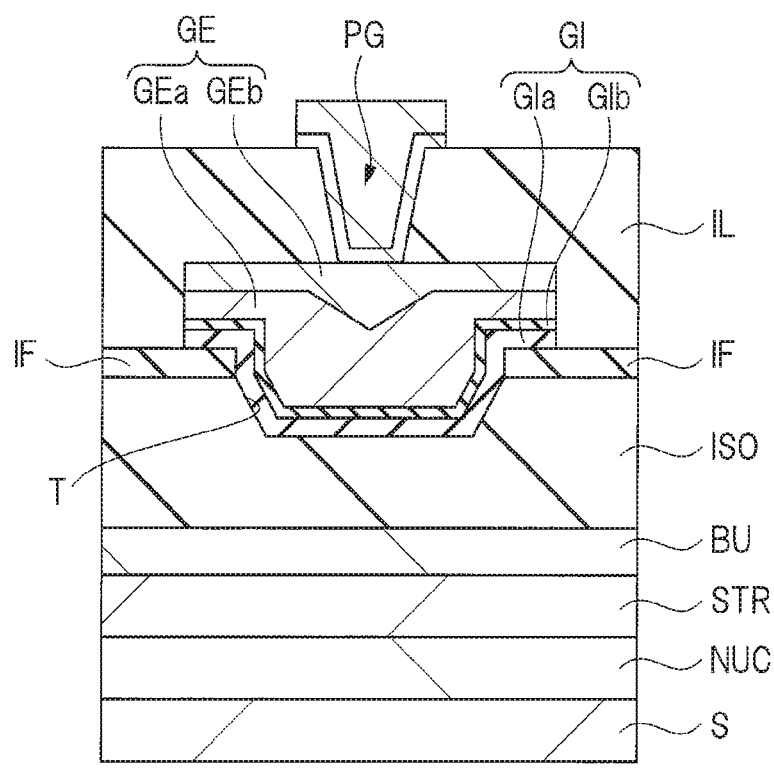
FIG. 27 is a cross-sectional view illustrating the configuration of the semiconductor device of the second embodiment.

Moreover, the gate electrodes GE are drawn out, for example, to an element separation region ISO outside the active region (B-B part on the right side in FIG. 26). And, this drawn-out portion is connected to, for example, wires of other wire layers via a plug PG. Note that FIG. 27 is a cross-sectional view illustrating the configuration of the semiconductor device of the present embodiment. FIG. 27 corresponds to, for example, the B-B cross section in FIG. 26. The plugs PG are formed of, for example, an Al/TiN film.

Third Embodiment

In the first embodiment (FIG. 1), the oxide film (GIa) of the lower layer of the gate insulating film GI is the oxide film of the first metal. However, this oxide film of the lower layer may be a silicon oxide film. That is, Si (semiconductor) is used as an element constituting the oxide film of the lower layer.

[Description of Structure]

Figure 28:
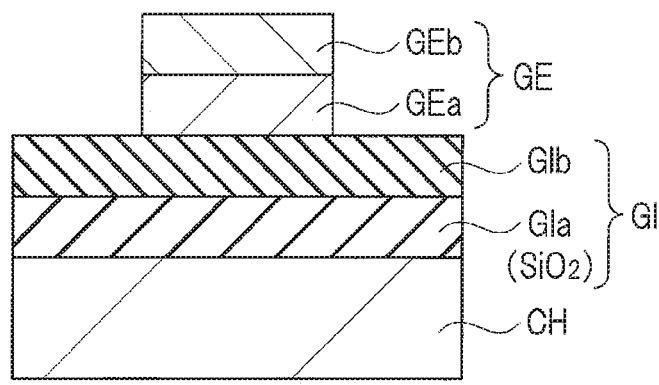
FIG. 28 is a cross-sectional view illustrating a configuration of a semiconductor device of a third embodiment.

FIG. 28 is a cross-sectional view illustrating the configuration of a semiconductor device of the present embodiment. The semiconductor device of the present embodiment is the same as that of the first embodiment except that a first gate insulating film GIa is a silicon oxide film.

As illustrated in FIG. 28, like the first embodiment, the semiconductor device of the present embodiment has a gate electrode GE (GEa, GEb) disposed on a channel layer CH formed of a nitride semiconductor via a gate insulating film GI.

Herein, the gate insulating film GI has the silicon oxide film ($SiO_2$), which is the first gate insulating film GIa and formed on the channel layer CH, and a second gate insulating film GIb formed on the first gate insulating film GIa. And, the gate electrode GE has a first gate electrode GEa formed on the second gate insulating film GIb and a second gate electrode GEb formed on the first gate electrode GEa.

The silicon oxide film ($SiO_2$) is thus provided as the first gate insulating film GIa. Moreover, an oxide film of the second metal (M2) is provided as the second gate insulating film GIb. The second metal is one or more elements selected from the group of Al, Hf, Zr, Ta, Ti, Nb, La, Y and Mg. In this case, the oxide of the second metal is, for example, aluminum oxide ($Al_2O_3$), hafnium oxide ($HfO_2$), zirconium oxide ($ZrO_2$), tantalum oxide ($Ta_2O_5$), titanium oxide ($TiO_2$), niobium oxide ($Nb_2O_5$), lanthanum oxide ($La_2O_3$), yttrium oxide ($Y_2O_3$) or magnesium oxide (MgO).

In this case, the electronegativity of each of the elements (Si, M2) constituting the two gate insulating films (GIa, GIb) is Si>M2. Also in this case, the polarization effect of oxygen described in the first embodiment occurs, and the flat band Vfb shifts in the positive direction.

Moreover, like the case of the first embodiment, the gate electrode GE is configured in the stacked structure, that is, the nitride containing the third metal and the fourth metal are stacked to be used and the fourth metal is disposed at the upper layer. Thus, the diffusion of oxygen to the gate insulating film GI can be prevented, the polarization of oxygen (stacking effect of the gate insulating film) can be maintained, and the shift effect of the flat band Vfb can be maintained. In particular, even when the annealing treatment is performed after the gate insulating film GI is formed, the diffusion of oxygen by the annealing treatment can be reduced and the stacking effect of the gate insulating film can be maintained.

[Description of Manufacturing Method]

Next, a manufacturing method of the semiconductor device of the present embodiment will be described. The manufacturing method of the semiconductor device of the present embodiment is the same as that of the first embodiment except a step of forming the gate insulating film GI.

That is, the silicon oxide film ($SiO_2$ film) is deposited as the first gate insulating film GIa on the channel layer CH by using a deposition method after the surface of the channel layer (i-GaN layer, GaN substrate) CH is washed, like in the first embodiment.

For example, a silicon oxide film ($SiO_2$ film) with a film thickness of about 3 nm is deposited by an ALD method using trisdimethylaminosilane ($SiH(N(CH_3)_2)_3$, TDMAS) and ozone ($O_3$, oxidizing agent) as source gases in an atmosphere of 480° C. The film thickness of the silicon oxide film can be adjusted within a range of, for example, 3 nm to 20 nm. The silicon oxide film may be deposited by using a CVD method (a thermal CVD method, a plasma CVD method or the like) besides the ALD method. Note that, according to the studies by the inventor, a sufficient shift effect of the flat band Vfb can be obtained by the aforementioned polarization of oxygen even with the film thickness of about 3 to 5 nm.

Next, heat treatment is performed. For example, the heat treatment is performed for about one minute at 750° C. in a nitrogen ($N_2$) atmosphere. This heat treatment reduces the traps (trap levels, defects) in the first gate insulating film GIa (herein, the silicon oxide film).

Next, the second gate insulating film (the oxide film of the second metal) GIb is formed on the first gate insulating film GIa. For example, like in the first embodiment, an aluminum oxide film ($Al_2O_3$ film) with a film thickness of about 50 nm to 100 nm is deposited as the second gate insulating film GIb.

Next, heat treatment is performed. For example, the heat treatment is performed for about one minute at 750° C. in a nitrogen ($N_2$) atmosphere. This heat treatment reduces the traps (trap levels, defects) in the second gate insulating film GIb (herein, the aluminum oxide film). Note that, although the heat treatment is separately performed after each of the gate insulating films (GIa, GIb) is formed in the above steps, the heat treatment may be collectively performed after the second gate insulating film GIb is formed.

Thus, the gate insulating film GI, in which the first gate insulating film GIa (silicon oxide film) and the second gate insulating film GIb (aluminum oxide film) are stacked in order from the bottom, can be formed.

Next, the gate electrode GE (GEa, GEb) is formed on the gate insulating film GI, like in the first embodiment.

Note that the gate insulating film GI of the present embodiment may be used as the gate insulating film GI of the second embodiment.

Figure 29:
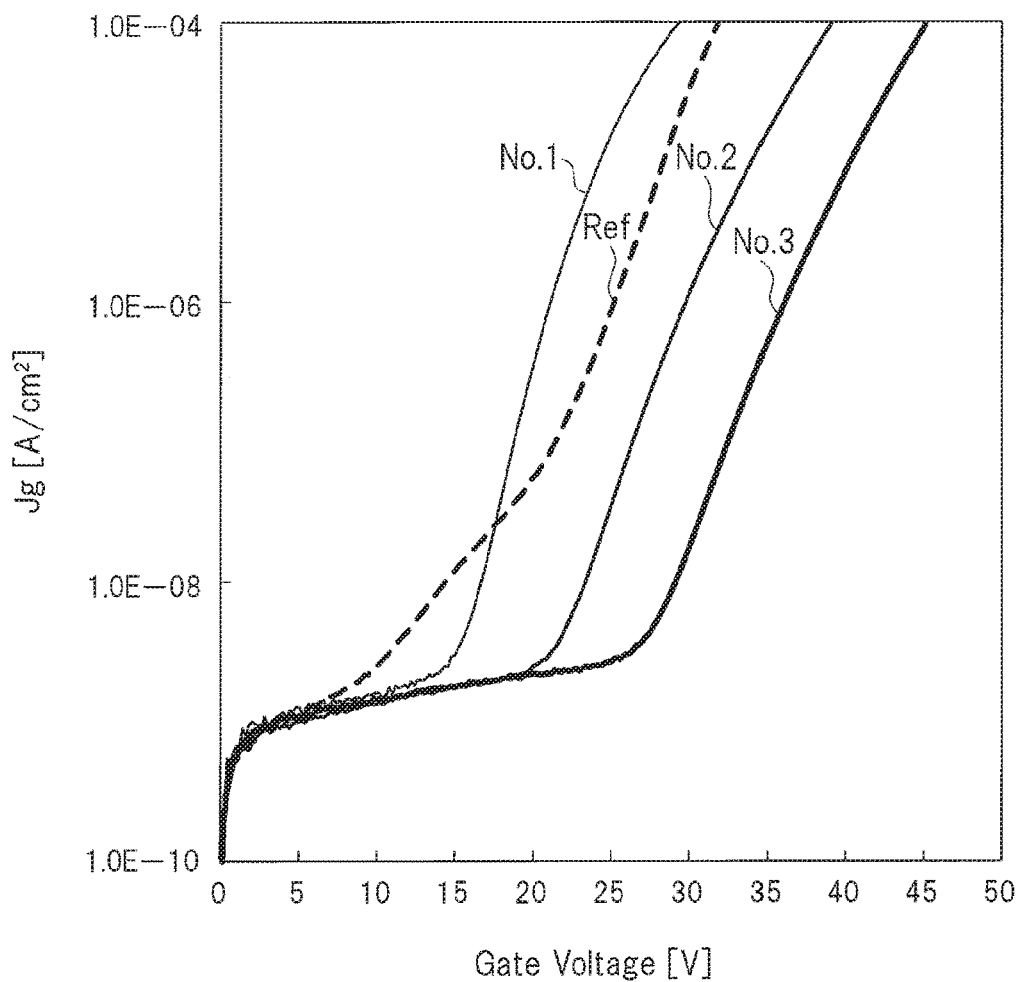
FIG. 29 is a graph showing a stacking effect of the gate insulating film.

FIG. 29 is a graph showing the stacking effect of the gate insulating film. The horizontal axis indicates the gate voltage (gate voltage [V]), and the vertical axis indicates the current (Jg [$A/cm^2$]). For example, by using the semiconductor device illustrated in FIG. 28, the I-V characteristics thereof was investigated. However, the gate electrode was a single layer. A stacked film of $Al_2O_3/SiO_2$ was used for each of Ref, No. 1, No. 2 and No. 3, and the film thicknesses of $SiO_2$ were 0 nm, 3 nm, 5 nm and 10 nm. No. 1, No. 2 and No. 3, that is, when the film thicknesses of $SiO_2$ are 3 nm to 10 nm, the initial voltage of the current becomes high. This is considered to be due to the shift effect of the flat band Vfb and the withstand voltage enhancement effect.

And, when the stacked structure of the gate electrode is added to the stacked structure of the aforementioned gate insulating film, the shift effect of the flat band Vfb can be maintained so that the initial voltage of the above current can be maintained.

Fourth Embodiment

In the first embodiment (FIG. 1), the gate insulating film GI has two layers (GIa, GIb). However, the gate insulating film GI may have three layers, in which a third gate insulating film (undermost gate insulating film) GIu may be provided at the lower layer (closer to the substrate or the channel layer) of the stacked film of the first gate insulating film GIa and the second gate insulating film GIb. Then, Si (semiconductor) is used as an element constituting this third gate insulating film (undermost gate insulating film) GIu.

[Description of Structure]

Figure 30:
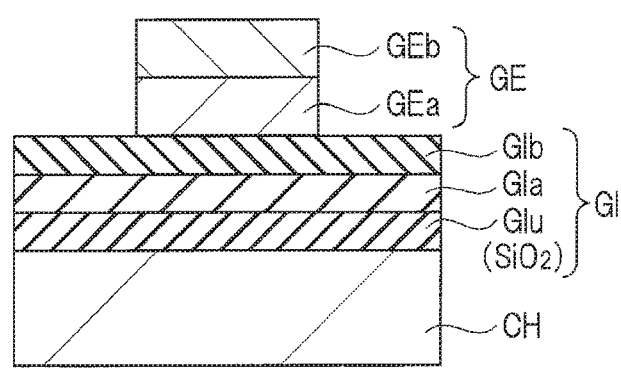
FIG. 30 is a cross-sectional view illustrating a configuration of a semiconductor device of a fourth embodiment.

FIG. 30 is a cross-sectional view illustrating the configuration of a semiconductor device of the present embodiment. The semiconductor device of the present embodiment is the same as that of the first embodiment except that the gate insulating film GI is configured by three layers.

As illustrated in FIG. 30, like the first embodiment, the semiconductor device of the present embodiment has a gate electrode GE (GEa, GEb) disposed on a channel layer CH formed of a nitride semiconductor via a gate insulating film GI.

Herein, the gate insulating film GI has a silicon oxide film ($SiO_2$), which is a third gate insulating film GIu and formed on the channel layer CH, a first gate insulating film GIa formed on the third gate insulating film GIu, and a second gate insulating film GIb formed on the first gate insulating film GIa. The first gate insulating film GIa is formed of an oxide of the first metal. The second gate insulating film GIb is formed of an oxide of the second metal. And, the electronegativity of the second metal is lower than the electronegativity of the first metal. Moreover, the electronegativity of the first metal is lower than the electronegativity of Si.

Herein, the gate electrode GE has a first gate electrode GEa formed on the channel layer CH and a second gate electrode GEb formed on the first gate electrode GEa and is formed of the same material as the gate electrode (the first gate electrode GEa, the second gate electrode GEb) described in the first embodiment. That is, the first gate electrode GEa is formed of a nitride of the third metal (a nitride containing the third metal, a nitride film of the third metal). The second gate electrode GEb is formed of a fourth metal. And, N/M3, the composition ratio of nitrogen (N) to the third metal (M3) in the nitride of the third metal, is preferably greater than 1. Moreover, the film thickness of the fourth metal is preferably 50 nm or more.

The silicon oxide film ($SiO_2$) is thus provided as the third gate insulating film (undermost gate insulating film) GIu. In this case, the electronegativity of each of the elements (Si, M1, M2) constituting the three gate insulating films (GIu, GIa, GIb) can be made smaller in order from the lower layer. Accordingly, the polarization effect of oxygen described in the first embodiment is increased, and an amount of the shift of the flat band Vfb is increased.

Moreover, like the case of the first embodiment, the gate electrode GE is configured in the stacked structure, that is, the nitride containing the third metal and the fourth metal are stacked to be used and the fourth metal is disposed at the upper layer. Thus, the diffusion of oxygen to the gate insulating film GI can be prevented, the polarization of oxygen (stacking effect of the gate insulating film) can be maintained, and the shift effect of the flat band Vfb can be maintained. In particular, even when the annealing treatment is performed after the gate insulating film GI is formed, the diffusion of oxygen by the annealing treatment can be reduced and the stacking effect of the gate insulating film can be maintained.

[Description of Manufacturing Method]

Next, a manufacturing method of the semiconductor device of the present embodiment will be described. The manufacturing method of the semiconductor device of the present embodiment is the same as that of the first embodiment except a step of forming the gate insulating film GI.

That is, the silicon oxide film ($SiO_2$ film) is deposited as the third gate insulating film (undermost gate insulating film) GIu on the channel layer CH by using a deposition method after the surface of the channel layer (i-GaN layer, GaN substrate) CH is washed, like in the first embodiment.

For example, a silicon oxide film (SiO₂ film) with a film thickness of about 3 nm is deposited by an ALD method using trisdimethylaminosilane (SiH(N(CH$_3$)$_2$)$_3$, TDMAS) and ozone (O$_3$, oxidizing agent) as source gases in an atmosphere of 480° C. The film thickness of the silicon oxide film can be adjusted within a range of, for example, 3 nm to 20 nm. The silicon oxide film may be deposited by using a CVD method (a thermal CVD method, a plasma CVD method or the like) besides the ALD method. Note that, according to the studies by the inventor, a sufficient shift effect of the flat band Vfb can be obtained by the aforementioned polarization of oxygen even with the film thickness of about 3 to 5 nm.

Next, heat treatment is performed. For example, the heat treatment is performed for about one minute at 750° C. in a nitrogen (N$_2$) atmosphere. This heat treatment reduces the traps (trap levels, defects) in the third gate insulating film GIu (herein, the silicon oxide film).

Next, the first gate insulating film (the oxide film of the first metal) GIa is formed on the third gate insulating film GIu. For example, like in the first embodiment, an aluminum oxide film (Al$_2$O$_3$ film) with a film thickness of about 50 nm to 100 nm is deposited as the first gate insulating film GIa.

Next, heat treatment is performed. For example, the heat treatment is performed for about one minute at 750° C. in a nitrogen (N$_2$) atmosphere. This heat treatment reduces the traps (trap levels, defects) in the first gate insulating film GIa (herein, the aluminum oxide film).

Next, the second gate insulating film (the oxide film of the second metal) GIb is formed on the first gate insulating film GIa. For example, like in the first embodiment, a hafnium oxide film (HfO$_2$ film) with a film thickness of about 2 nm is deposited as the second gate insulating film GIb.

Next, heat treatment is performed. For example, the heat treatment is performed for about one minute at 750° C. in a nitrogen (N$_2$) atmosphere. This heat treatment reduces the traps (trap levels, defects) in the second gate insulating film GIb (herein, the hafnium oxide film). Note that, although the heat treatment is separately performed after each of the gate insulating films (GIu, GIa, GIb) is formed in the above steps, the heat treatment may be collectively performed after the second gate insulating film GIb is formed.

Thus, the gate insulating film GI, in which the third gate insulating film GIu (silicon oxide film), the first gate insulating film GIa (aluminum oxide film) and the second gate insulating film GIb (hafnium oxide film) are stacked in order from the bottom, can be formed.

Next, the gate electrode GE (GEa, GEb) is formed on the gate insulating film GI, like in the first embodiment.

Note that the gate insulating film GI of the present embodiment with three layers may be used as the gate insulating film GI of the second embodiment.

Fifth Embodiment

In the fourth embodiment (FIG. 30), the silicon oxide film is used as the third gate insulating film (undermost gate insulating film) GIu. However, a silicon nitride film may be provided.

[Description of Structure]

Figure 31:
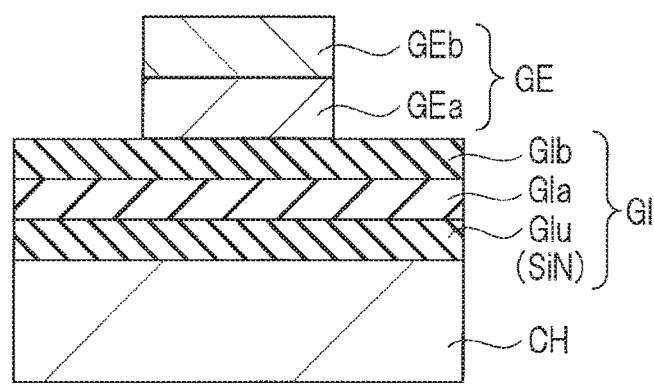
FIG. 31 is a cross-sectional view illustrating a configuration of a semiconductor device of a fifth embodiment.

FIG. 31 is a cross-sectional view illustrating the configuration of a semiconductor device of the present embodiment. The semiconductor device of the present embodiment is the same as that of the fourth embodiment except the third insulating film (undermost gate insulating film) GIu of the gate insulating film GI.

As illustrated in FIG. 31, like the first embodiment, the semiconductor device of the present embodiment has a gate electrode GE (GEa, GEb) disposed on a channel layer CH formed of a nitride semiconductor via a gate insulating film GI.

Herein, the gate insulating film GI has a silicon nitride film (SiN$_X$), which is a third gate insulating film GIu and formed on the channel layer CH, a first gate insulating film GIa formed on the third gate insulating film GIu, and a second gate insulating film GIb formed on the first gate insulating film GIa. And, the gate electrode GE has a first gate electrode GEa formed on the second gate insulating film GIb and a second gate electrode GEb formed on the first gate electrode GEa.

The silicon nitride film (SiN$_X$) is thus provided as the third gate insulating film (undermost gate insulating film) GIu. In this case, since the silicon nitride film (GIu) does not contain oxygen, the polarization of oxygen does not occur at the interface with the first gate insulating film GIa. Thus, the flat band Vfb shifts in the positive direction due to the polarization occurred at the interface between the first gate insulating film GIa and the second gate insulating film GIb.

Moreover, oxidation of the channel layer CH (herein, the i-GaN layer) can be suppressed by using the silicon nitride film (SiN$_X$) as the third gate insulating film (undermost gate insulating film) GIu. In particular, when a nitride semiconductor such as a GaN layer is oxidized, many interface states are generated at the interface with the gate insulating film GI. In this case, the mobility of the MISFET decreases. This degrades the performance of the MISFET.

To enhance the film quality of the gate insulating film GI, oxidation annealing after the film formation is effective. However, if the nitride semiconductor such as the GaN layer and the oxide film are contacted, the oxidation of the nitride semiconductor may further proceed due to the oxidation annealing.

By contrast, when the nitride film is provided as the undermost gate insulating film (third gate insulating film) GIu like in the present embodiment, the above oxidation is suppressed. This increases the process risk margin. In other words, oxidation of the nitride semiconductor due to the contact with the gate insulating film GI can be suppressed. Moreover, even when oxidation annealing is performed, oxidation of the nitride semiconductor can be suppressed.

Moreover, like the case of the first embodiment, the gate electrode GE is configured in the stacked structure, that is, the nitride containing the third metal and the fourth metal are stacked to be used and the fourth metal is disposed at the upper layer. Thus, the di f fusion of oxygen to the gate insulating film GI can be prevented, the polarization of oxygen (stacking effect of the gate insulating film) can be maintained, and the shift effect of the flat band Vfb can be maintained. In particular, even when the annealing treatment is performed after the gate insulating film GI is formed, the diffusion of oxygen by the annealing treatment can be reduced and the stacking effect of the gate insulating film can be maintained.

[Description of Manufacturing Method]

Next, a manufacturing method of the semiconductor device of the present embodiment will be described. The manufacturing method of the semiconductor device of the present embodiment is the same as that of the fourth embodiment except a step of forming the third gate insulating film (undermost gate insulating film) GIu.

That is, the silicon nitride film (SiN$_x$ film) is deposited as the third gate insulating film (undermost gate insulating film) GIu on the channel layer CH by using a deposition method after the surface of the channel layer (i-GaN layer, GaN substrate) CH is washed, like in the first and fourth embodiments.

For example, a silicon nitride film ($SiN_x$ film) with a film thickness of about 4 nm is deposited by an ALD method using trisdimethylaminosilane ($SiH(N(CH_3)_2)_3$, TDMAS) and ammonia ($NH_3$) as source gases in an atmosphere of 480° C. The film thickness of the silicon nitride film can be adjusted within a range of, for example, 1 nm to 15 nm. The silicon nitride film may be deposited by using a CVD method (a thermal CVD method, a plasma CVD method or the like) besides the ALD method.

Next, heat treatment is performed. For example, the heat treatment is performed for about one minute at 750° C. in a nitrogen ($N_2$) atmosphere. This heat treatment reduces the traps (trap levels, defects) in the third gate insulating film GIu (herein, the silicon nitride film).

Next, the first gate insulating film (the oxide film of the first metal) GIa is formed on the third gate insulating film GIu. For example, like in the first embodiment, an aluminum oxide film ($Al_2O_3$ film) with a film thickness of about 50 nm to 100 nm is deposited as the first gate insulating film GIa.

Next, heat treatment is performed. For example, the heat treatment is performed for about one minute at 750° C. in a nitrogen ($N_2$) atmosphere. This heat treatment reduces the traps (trap levels, defects) in the first gate insulating film GIa (herein, the aluminum oxide film).

Next, the second gate insulating film (the oxide film of the second metal) GIb is formed on the first gate insulating film GIa. For example, like in the first embodiment, a hafnium oxide film ($HfO_2$ film) with a film thickness of about 2 nm is deposited as the second gate insulating film GIb.

Next, heat treatment is performed. For example, the heat treatment is performed for about one minute at 750° C. in a nitrogen ($N_2$) atmosphere. This heat treatment reduces the traps (trap levels, defects) in the second gate insulating film GIb (herein, the hafnium oxide film). Note that, although the heat treatment is separately performed after each of the gate insulating films (GIu, GIa, GIb) is formed in the above steps, the heat treatment may be collectively performed after the second gate insulating film GIb is formed.

Thus, the gate insulating film GI, in which the third gate insulating film GIu (silicon nitride film), the first gate insulating film GIa (aluminum oxide film) and the second gate insulating film GIb (hafnium oxide film) are stacked in order from the bottom, can be formed.

Next, the gate electrode GE (GEa, GEb) is formed on the gate insulating film GI, like in the first embodiment.

Note that the gate insulating film GI of the present embodiment with three layers may be used as the gate insulating film GI of the second embodiment.

Sixth Embodiment

In the aforementioned first to fifth embodiments, the nitride semiconductor (GaN layer) is used as the channel layer CH. However, a different semiconductor layer may be used. In the present embodiment, a SiC layer (SiC substrate) is used.

[Description of Structure]

Figure 32:
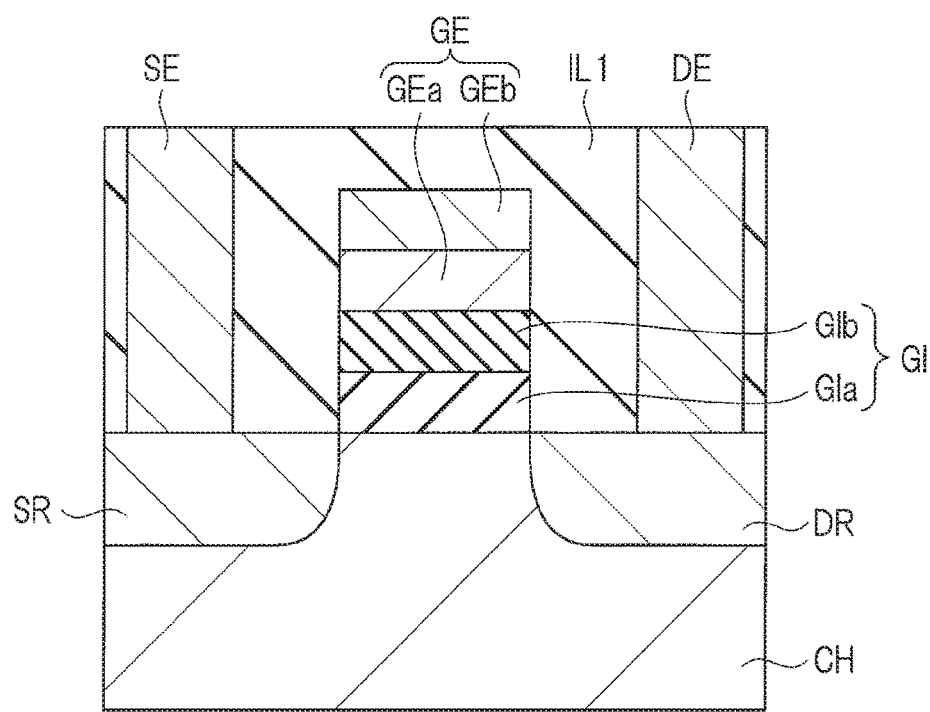
FIG. 32 is a cross-sectional view illustrating a configuration of a semiconductor device of a sixth embodiment.

FIG. 32 is a cross-sectional view illustrating the configuration of a semiconductor device of the present embodiment.

As illustrated in FIG. 32, the semiconductor device of the present embodiment has a gate electrode GE disposed on a channel layer CH formed of SiC via a gate insulating film GI.

Then, the gate insulating film GI has a first gate insulating film GIa formed on the channel layer CH and a second gate insulating film GIb formed on the first gate insulating film GIa. And, the gate electrode GE has a first gate electrode GEa formed on the second gate insulating film GIb and a second gate electrode GEb formed on the first gate electrode GEa. A SiC layer may be provided as the channel layer CH on a substrate such as Si. Alternatively, a SiC substrate may be used as the substrate, and this substrate may be used as the channel layer CH. Note that a source region SR and a drain region DR, which are n-type or p-type impurity injection regions, are disposed in the channel layer CH at both sides of the gate electrode GE. Then, a source electrode SE and a drain electrode DE are further disposed on the source region SR and the drain region DR.

Herein, the gate insulating film GI has a first gate insulating film GIa formed on the channel layer CH and a second gate insulating film GIb formed on the first gate insulating film GIa. The first gate insulating film GIa is formed of a silicon oxide film ($SiO_2$). And, the second gate insulating film GIb is formed of an oxide of the second metal. Moreover, the electronegativity of the second metal is lower than the electronegativity of Si. In other words, this gate insulating film GI is formed by using a silicon oxide film ($SiO_2$) as the oxide of the first metal of the gate insulating film GI of the first embodiment.

Moreover, the first gate insulating film ($SiO_2$) GIa may be a thermal oxide film of the channel layer (SiC layer) CH or a deposited film. As the thermal oxidation method, dry oxidation or wet oxidation can be used. Alternatively, ozone may be used for the oxidation. As the deposition method, an ALD method, a CVD method or a PVD method may be used. The film thickness of the silicon oxide film can be adjusted within a range of 1 nm to 10 nm.

The second metal is a metal with lower electronegativity than Si, for example, aluminum (Al). In this case, the oxide of the second metal is aluminum oxide ($Al_2O_3$). The film thickness of this oxide of the first metal is, for example, about 60 nm.

As the second metal, Hf, Zr, Ta, Ti, Nb, La, Y, Mg or the like can be used besides Al. The oxide film in this case is, for example, hafnium oxide ($HfO_2$), zirconium oxide ($ZrO_2$), tantalum oxide ($Ta_2O_5$), titanium oxide ($TiO_2$), niobium oxide ($Nb_2O_5$), lanthanum oxide ($La_2O_3$), yttrium oxide ($Y_2O_3$) or magnesium oxide (MgO). The composition ratio of the second metal to oxygen is not limited to the above. Moreover, two or more elements may be contained as the second metal. In this case, there will be a compound of two kinds of metals and oxygen. However, in this case, the electronegativities of both of the two or more elements must be lower than the electronegativity of Si. However, it is inevitable to contain a metal as an impurity (e.g., a concentration of the metal is 0.01% or less) upon the manufacture, and thus a metal impurity may be sometimes contained irrespective of the magnitude of the electronegativity. Moreover, a suitable combination of the film thickness of each of the first gate insulating film GIa and the second gate insulating film GIb can be selected depending on the characteristics required for the gate insulating film GI and the film quality (electrical characteristics such as permittivity and leak characteristics) attributed to the deposition method.

And, the gate electrode GE has a first gate electrode GEa formed on the second gate insulating film GIb and a second gate electrode GEb formed on the first gate electrode GEa.

The first gate electrode GEa is a nitride film containing a third metal. As the third metal, Ti, Ta, W or the like can be used. In this case, the nitride film containing the third metal is TiN, TaN or WN. The third metal is preferably one having conductivity, high processability and low oxygen absorbability and suppliability. In this respect, it is suitable to use Ti as the third metal.

The second gate electrode GEb is formed of a fourth metal. As the fourth metal, W, Ru or Ir can be used. The fourth metal is preferably one which has conductivity even after oxidation, has high processability and blocks entry of oxygen into the first gate electrode GEa of the lower layer. In this respect, it is suitable to use W as the fourth metal.

Thus, in the present embodiment, by stacking the oxides of both of Si and the second metal to be used as the gate insulating film GI and disposing the oxide film of the second metal with lower electronegativity than Si at the upper layer, the threshold voltage (Vth) can be positive (Vth>0) (stacking effect of the gate insulating film).

Moreover, by stacking the nitride containing the third metal and the fourth metal to be used as the gate electrode GE and disposing the fourth metal at the upper layer, the diffusion of oxygen to the gate insulating film GI can be prevented and variations in the threshold voltage (Vth) can be reduced. In particular, even after the annealing treatment described later, the diffusion of oxygen can be reduced and the stacking effect of the gate insulating film can be maintained.

[Description of Manufacturing Method]

Next, a manufacturing method of the semiconductor device of the present embodiment will be described as well as the configuration of the semiconductor device will be more apparent.

First, the substrate (not shown in the drawing) on which the channel layer CH is formed is prepared. The channel layer CH is a SiC layer. The SiC layer can be formed by using, for example, a CVD method or the like. A SiC substrate is used as the substrate, and this substrate may be used as the channel layer CH.

Next, the surface of the channel layer (SiC layer) CH is washed by using sulfuric acid/hydrogen peroxide solution, ammonia hydrogen peroxide based solution or the like. Subsequently, the gate insulating film GI having the first gate insulating film GIa and the second gate insulating film GIb is formed on the channel layer CH.

First, the first gate insulating film GIa is formed on the channel layer CH. For example, a silicon oxide film ($SiO_2$ film) is formed as the first gate insulating film GIa by dry oxidation. For example, dry oxidation is performed at an oxidation temperature of 1300° C. in a mixed gas of $O_2$ and $N_2$ to form a silicon oxide film with a film thickness of, for example, about 10 nm. Note that the oxidation method is not limited to the dry oxidation, and thermal oxidation with a different oxidizing agent may be used. Moreover, the silicon oxide film may be formed by using a deposition method such as a CVD method, an ALD method, a PVD method or the like.

Next, the interface ($SiO_2$/SiC interface) between the first gate insulating film GIa and the channel layer CH is nitrided. As the nitriding treatment, for example, a heat treatment is performed for one hour at 1000° C. under an atmosphere containing nitrogen monoxide (NO). This nitriding treatment reduces the interface states (dangling bonds and the like) being generated at the above interface. As the gas used for this nitriding treatment, $N_2O$, $NH_3$ or the like may be used besides the above nitrogen monoxide (NO). Alternatively, a mixed gas of these gases may be used. Alternatively, a plurality of gases may be used while being switched over time. Moreover, not only the nitriding reaction but also the oxidation reaction may occur by this nitriding treatment (oxynitriding treatment). Thus, appropriate film quality improving treatment is preferably performed depending on the film formation method of the silicon oxide film, the film quality and the interface states at the interface. Herein, a method of performing the nitriding treatment on the interface states has been described as the film quality improving treatment. However, besides this, hydrogenation treatment, Group V treatment (e.g., phosphorization) other than nitrogen, or the like may be performed. Even with these treatments, the interface states can be intended to be reduced.

Next, the second gate insulating film (the oxide film of the second metal) GIb is formed on the first gate insulating film (silicon oxide film) GIa. For example, an aluminum oxide film ($Al_2O_3$ film) is deposited as the second gate insulating film GIb by using a deposition method. For example, an aluminum oxide film ($Al_2O_3$ film) with a film thickness of about 60 nm is deposited by an ALD method using trimethylaluminum ($Al(CH_3)_3$, TMA) and $H_2O$ (oxidizing agent) as source gases in an atmosphere of 400° C. According to the ALD method, a film with good controllability, good coatability and good film quality can be formed. Note that ozone ($O_3$) may be used as the oxidizing agent besides $H_2O$. Note that the aluminum oxide film ($Al_2O_3$ film) may be formed by using an oxygen plasma CVD method besides the ALD method. Next, heat treatment is performed. For example, the heat treatment is performed for about 30 minutes at 600° C. in a nitrogen ($N_2$) atmosphere. Note that, although Al is used as the metal for the second gate insulating film GIb herein, the second metal may use an oxide of one or more elements selected from the group of Hf, Zr, Ta, Ti, Nb, La, Y and Mg.

Thus, the gate insulating film GI having the stacked film of the first gate insulating film GIa (silicon oxide film) and the second gate insulating film GIb (aluminum oxide film) is formed.

Next, the gate electrode GE is formed on the gate insulating film GI, like in the first embodiment. For example, a titanium nitride film (TiN film) is formed as the first gate electrode GEa, and a tungsten film (W film) is further formed thereon as the second gate electrode GEb. These stacked films are successively formed using a multi-target sputtering apparatus. For example, a titanium nitride film of about 20 nm is deposited on the second gate insulating film GIb by a reactive sputtering method using a Ti metal target and a mixed gas of argon (Ar) and nitrogen ($N_2$). At this time, N/Ti, the ratio of N to Ti in the TiN film to be formed, is set to greater than 1. The proportion of N in TiN can be controlled by adjusting the amount of nitrogen in the mixed gas of argon (Ar) and nitrogen ($N_2$).

Subsequently, a tungsten film of about 100 nm is deposited as the second gate electrode GEb on the first gate electrode GEa by a sputtering method using a W metal target and argon (Ar) gas. As described in the first embodiment, it is confirmed that the oxygen concentrations decrease by one digit when the film thickness of the second gate electrode (W film) GEb is about 50 nm. Thus, the film thickness of the second gate electrode (W film) GEb is preferably 50 nm or more. Furthermore, it is preferable to form a W film with a film thickness of 100 nm or more when the heat treatment (recovery annealing) is performed after the steps of forming the second gate electrode (W film) GEb and then exposing the second gate electrode GEb to the atmosphere. In addition, the upper limit of the film thickness of the second gate electrode (W film) GEb is, for example, about 500 nm.

Next, heat treatment is performed. This heat treatment is a heat treatment for reducing the traps (trap levels, defects) in the gate insulating films ($Al_2O_3$ and $HfO_2$) caused by the plasma and charged particles generated upon the film formation of the gate electrode GE. As the heat treatment conditions, optimum temperature, time and the like may be selected depending on the PVD conditions (e.g., power and time) of the first gate electrode GEa and the second gate electrode GEb. According to the studies by the inventor, the heat treatment is preferably performed with the temperature within a range of 400° C. to 600° C. and the time within a range of 10 minutes to 60 minutes. And, as the heat treatment atmosphere, for example, an atmosphere of inert gas such as nitrogen ($N_2$) is preferably used.

Next, the first gate electrode GEa and the second gate electrode GEb are patterned (processed) by using a photolithography technique and an etching technique, thereby forming the gate electrode GE with a desired shape. The second gate electrode GEb covers an entirety of the upper surface of the first gate electrode GEa. Note that, upon the etching of this gate electrode GE, the gate insulating film GI of the lower layer may be etched. Moreover, the above heat treatment may be performed after this patterning step. As the material of the first gate electrode GEa, for example, TaN, WN or the like which enables easy gate etching may be used. As the second gate electrode GEb, for example, Ru, Ir or the like may be used.

Thereafter, the source region SR and the drain region DR are formed in the channel layer CH at both sides of the gate electrode GE by injecting n-type or p-type impurity. Next, for example, a silicon oxide film is formed as the insulating layer IL1 on the gate electrode GE, the source region SR and the drain region DR by using a CVD method or the like. Subsequently, by using a photolithography technique and an etching technique, the insulating layer IL1 in the source region SR and the drain region DR is removed by etching to form the contact holes. Next, the source electrode SE and the drain electrode DE are formed on the source region SR and the drain region DR at both sides of the gate electrode GE, respectively. For example, a conductive film is formed on the insulating layer IL1 including the insides of the contact holes. Next, the above conductive film is patterned by using a photolithography technique and an etching technique. Note that the source electrode SE and the drain electrode DE may be formed by using a so-called damascene method. Moreover, a plurality of wires may be formed on the insulating layer IL1 thereafter.

By the above steps, the semiconductor device of the present embodiment can be formed.

Thus, in the present embodiment, the stacked film of the oxide of Si and the oxide of the second metal, which has lower electronegativity than the Si and is disposed thereon, is used as the gate insulating film GI. Therefore, the flat band voltage (Vfb) can be shifted in the positive direction as in the case of the first embodiment. This can shift the threshold voltage (Vth) in the positive direction. Then, by adjusting an amount of the shift, the threshold voltage (Vth) can be positive (Vth>0), and the normally-off characteristics can be enhanced.

Moreover, by stacking the nitride containing the third metal and the fourth metal to be used as the gate electrode GE and disposing the fourth metal at the upper layer, the diffusion of oxygen to the gate insulating film GI can be prevented and the variations in the threshold voltage (Vth) can be reduced, as in the case of the first embodiment. In particular, even after the annealing treatment described later, the diffusion of oxygen can be reduced and the stacking effect of the gate insulating film can be maintained.

Furthermore, by setting N/M3, the composition ratio of nitrogen (N) to the third metal (M3) in the nitride of the third metal, to greater than 1, the same effect as in the first embodiment can be exerted.

In addition, the impurity concentration for Vth control of the channel layer CH can be reduced by using the SiC layer as the channel layer CH, shifting the flat band Vfb in the positive direction and shifting the threshold voltage (Vth) in the positive direction. The impurities lower the mobility of carriers (electrons or positive holes) transiting in the channel layer CH (impurity scattering). Therefore, by reducing the impurity concentration of the channel layer, the mobility of carriers is enhanced. As a result, the On current of the MISFET can be increased. Although the mobility depends on the crystal planes forming the MISFET, the mobility of the SiC layer is smaller than the mobility of the Si layer. Thus, the effect of enhancing the mobility is useful.

Note that, although the stacked film (e.g., corresponding to the third embodiment) of the silicon oxide film and the aluminum oxide film is used as the gate insulating film GI in the present embodiment, the gate insulating films GI in the other first, fourth, and fifth embodiments may be applied.

While the invention made by the inventor of the present invention has been concretely described based on the embodiments in the foregoing, it is needless to say that the present invention is not limited to the foregoing embodiments and various modifications and alterations can be made within the scope of the present invention.

[Supplementary Note 1]

A semiconductor device includes:

a SiC layer;

a first gate insulating film provided on the SiC layer;

a second gate insulating film provided on the first gate insulating film;

a first gate electrode provided on the second gate insulating film; and a second gate electrode provided on the first electrode, and in the semiconductor device, the first gate insulating film is an oxide film containing a first metal or an oxide film containing silicon, the second gate insulating film is an oxide film containing a second metal, electronegativity of the second metal is smaller than that of the first metal or silicon, the first gate electrode is a nitride film containing a third metal, and the second gate electrode is formed of a fourth metal.

[Supplementary Note 2]

The semiconductor device according to supplementary note 1, in which the first metal is Al.

[Supplementary Note 3]

The semiconductor device according to supplementary note 2, in which the second metal is one or more elements selected from a group of Hf, Zr, Ta, Ti, Nb, La, Y and Mg.

[Supplementary Note 4]

The semiconductor device according to supplementary note 3, in which the third metal is Ti.

[Supplementary Note 5]

The semiconductor device according to supplementary note 4, in which the nitride film containing the third metal is titanium nitride, and a ratio (N/Ti) of nitrogen (N) to titanium (Ti) is greater than 1.

[Supplementary Note 6]

The semiconductor device according to supplementary note 4, in which the fourth metal is W.

[Supplementary Note 7]
The semiconductor device according to supplementary note 6, in which a film thickness of the second gate electrode is 50 nm or more.

[Supplementary Note 8]
The semiconductor device according to supplementary note 6, in which the second gate electrode covers an entirety of an upper surface of the first gate electrode.

[Supplementary Note 9]
A manufacturing method of a semiconductor device includes the steps of:
(a) preparing a nitride semiconductor layer;
(b) forming a first gate insulting film on the nitride semiconductor layer, the first gate insulating film being formed of an oxide film containing a first metal or an oxide film containing silicon;
(c) forming a second gate insulating film on the first gate insulating film, the second gate insulating film being formed of an oxide film of a second metal;
(d) forming a first gate electrode on the second gate insulating film, the first gate electrode being formed of a nitride film containing a third metal; and
(e) forming a second gate electrode on the first gate electrode, the second gate electrode being formed of a fourth metal, and in the method, electronegativity of the second metal is smaller than that of the first metal or silicon.

[Supplementary Note 10]
The manufacturing method of the semiconductor device according to supplementary note 8, in which the second gate electrode is formed without exposure to the air in the step (d) to the step (e) after the first gate electrode is formed.

[Supplementary Note 11]
The manufacturing method of the semiconductor device according to supplementary note 9, in which the first gate insulating film is formed of an oxide film containing silicon,
the second metal is one or more elements selected from a group of Al, Hf, Zr, Ta, Ti, Nb, La, Y and Mg,
the third metal is Ti, and
the fourth metal is W.

[Supplementary Note 12]
The semiconductor device according to supplementary note 1, in which the first gate insulating film is formed of an oxide film containing silicon,
the second metal is one or more elements selected from a group of Al, Hf, Zr, Ta, Ti, Nb, La, Y and Mg,
the third metal is Ti, and
the fourth metal is W.

REFERENCE SIGNS LIST

2DEG Two-Dimensional Electron Gas
BA Barrier Layer
BU Buffer Layer
CH Channel Layer
DE Drain Electrode
DL Drain Line
DR Drain Region
GE Gate Electrode
GEa First Gate Electrode
GEb Second Gate Electrode
GI Gate Insulating Film
GIa First Gate Insulating Film
GIb Second Gate Insulating Film
GIu Third Gate Insulating Film
IF Insulating Film
IL1 Insulating Layer
IL2 Insulating Layer
NUC Nucleation Layer
PG Plug
S Substrate
SE Source Electrode
SL Source Line
SR Source Region
STR Strain Relaxation Layer
T Groove

The invention claimed is:

1. A semiconductor device comprising:
a nitride semiconductor layer;
a first gate insulating film provided on the nitride semiconductor layer;
a second gate insulating film provided on the first gate insulating film;
a first gate electrode formed on a surface of the second gate insulating film and contacting the surface of the second gate insulating film; and
a second gate electrode provided on a surface of the first gate electrode and contacting the surface of the first gate electrode,
wherein the first gate insulating film is an oxide film containing a first metal or an oxide film containing silicon,
the second gate insulating film is an oxide film containing a second metal,
an electronegativity of the second metal is smaller than that of the first metal or silicon,
the first gate electrode is a nitride film containing a third metal, and
the second gate electrode is formed of a fourth metal, and
wherein the nitride film containing the third metal comprises titanium nitride having a ratio (N/Ti) of nitrogen (N) to titanium (Ti) which is greater than 1.

2. The semiconductor device according to claim 1, wherein the first metal is Al.

3. The semiconductor device according to claim 2, wherein the second metal is one or more elements selected from a group of Hf, Zr, Ta, Ti, Nb, La, Y and Mg.

4. The semiconductor device according to claim 1, wherein the fourth metal is W.

5. The semiconductor device according to claim 4, wherein a film thickness of the second gate electrode is 50 nm or more.

6. The semiconductor device according to claim 4, wherein the second gate electrode covers an entirety of an upper surface of the first gate electrode.

7. The semiconductor device according to claim 4, wherein the nitride semiconductor layer is GaN.

8. The semiconductor device according to claim 4 further comprising:
a third gate insulating film between the nitride semiconductor layer and the first gate insulating film,
wherein the third gate insulating film is a silicon oxide film or a silicon nitride film.

9. The semiconductor device according to claim 1, wherein the first gate insulating film is formed on a surface of the nitride semiconductor layer and contacts the surface of the nitride semiconductor layer, and
wherein the second gate insulating film is formed on a surface of the first gate insulating film and contacts a surface of the first gate insulating film.

10. The semiconductor device according to claim 1, wherein a thickness of the second gate insulating film is less than a thickness of the first gate insulating film.

11. The semiconductor device according to claim 1, further comprising:
an insulating film formed on the nitride semiconductor layer,
wherein a trench is formed in the insulating film and the nitride semiconductor layer, and a lowermost portion of the second gate electrode is formed outside of the trench.

12. The semiconductor device according to claim 1, wherein the nitride semiconductor layer comprises a first nitride semiconductor layer formed on a substrate, and a second nitride semiconductor layer formed on the first nitride semiconductor layer, and
wherein a trench is formed in the first and second nitride semiconductor layers and the first gate insulating film contacts the first nitride semiconductor layer in the groove formed in the first nitride semiconductor layer.

13. The semiconductor device according to claim 12, wherein a height of an upper surface of the second gate insulating film in the trench is less than a height of an upper surface of the second nitride semiconductor layer outside of the trench.

14. A semiconductor device, comprising:
a first nitride semiconductor layer formed above a substrate;
a second nitride semiconductor layer formed on the first nitride semiconductor layer;
a groove penetrating the second nitride semiconductor layer and reaching the first nitride semiconductor layer; and
a gate electrode disposed inside the groove via a gate insulating film,
wherein the gate insulating film includes a first gate insulating film provided on the first nitride semiconductor layer and a second gate insulating film provided on the first gate insulating film,
the gate electrode includes a first gate electrode formed on a surface of the second gate insulating film and contacting the surface of the second gate insulating film, and a second gate electrode provided on a surface of the first gate electrode and contacting the surface of the first gate electrode,
the first gate insulating film is an oxide film containing a first metal or an oxide film containing silicon,
the second gate insulating film is an oxide film containing a second metal,
an electronegativity of the second metal is smaller than that of the first metal or silicon,
the first gate electrode is a nitride film containing a third metal, and
the second gate electrode is formed of a fourth metal,
wherein the nitride film containing the third metal comprises titanium nitride having a ratio (N/Ti) of nitrogen (N) to titanium (Ti) which is greater than 1.

15. A manufacturing method of a semiconductor device, comprising:

(a) preparing a nitride semiconductor layer;
(b) forming a first gate insulting film on the nitride semiconductor layer, the first gate insulating film being formed of an oxide film containing a first metal or an oxide film containing silicon;
(c) forming a second gate insulating film on the first gate insulating film, the second gate insulating film being formed of an oxide film of a second metal;
(d) forming a first gate electrode on a surface of the second gate insulating film, the first gate electrode contacting the surface of the second gate insulating film and being formed of a nitride film containing a third metal; and
(e) forming a second gate electrode on a surface of the first gate electrode, the second gate electrode contacting the surface of the first gate electrode and being formed of a fourth metal,
wherein an electronegativity of the second metal is smaller than that of the first metal or silicon,
wherein the nitride film containing the third metal comprises titanium nitride having a ratio (N/Ti) of nitrogen (N) to titanium (Ti) which is greater than 1.

16. The manufacturing method of the semiconductor device according to claim 15,
wherein the second gate electrode is formed without exposure to the air in the step (d) to the step (e) after the first gate electrode is formed.

17. The manufacturing method of the semiconductor device according to claim 16, further comprising the step of:
(f) performing heat treatment under an inert gas atmosphere after the step (e).

18. The manufacturing method of the semiconductor device according to claim 16, further comprising a step of:
(g) processing a stacked film of the first gate electrode and the second gate electrode into a first shape after the step (e).

19. The manufacturing method of the semiconductor device according to claim 15,
wherein the first metal is Al.

20. The manufacturing method of the semiconductor device according to claim 19,
wherein the second metal is one or more elements selected from a group of Hf, Zr, Ta, Ti, Nb, La, Y and Mg.

21. The manufacturing method of the semiconductor device according to claim 15,
wherein the fourth metal is W.

22. The manufacturing method of the semiconductor device according to claim 21,
wherein the nitride semiconductor layer is GaN.

23. The manufacturing method of the semiconductor device according to claim 15,
wherein the first gate insulating film is formed of an oxide film containing silicon,
the second metal is one or more elements selected from a group of Al, Hf, Zr, Ta, Ti, Nb, La, Y and Mg, and
the fourth metal is W.

* * * * *